United States Patent
Chen et al.

(10) Patent No.: US 10,536,152 B2
(45) Date of Patent: Jan. 14, 2020

(54) OSCILLATING CIRCUIT AND METHOD FOR CALIBRATING A RESONANT FREQUENCY OF AN LC TANK OF AN INJECTION-LOCKED OSCILLATOR (ILO) OF THE OSCILLATING CIRCUIT WHILE STOPPING SELF-OSCILLATION OF THE ILO

(71) Applicant: KaiKuTek INC., Taipei (TW)

(72) Inventors: Pang-Ning Chen, Taipei (TW); Chen-Lun Lin, Hsinchu (TW); Ying-Chia Chen, Taoyuan (TW); Wei-Jyun Wang, Kaohsiung (TW); Mike Chun Hung Wang, Taipei (TW)

(73) Assignee: KaiKuTek INC., Taipei (TW)

( * ) Notice: Subject to any disclaimer, the term of this patent is extended or adjusted under 35 U.S.C. 154(b) by 0 days.

(21) Appl. No.: 16/166,154

(22) Filed: Oct. 21, 2018

(65) Prior Publication Data
US 2019/0319581 A1 Oct. 17, 2019

Related U.S. Application Data

(60) Provisional application No. 62/656,999, filed on Apr. 13, 2018.

(51) Int. Cl.
*H03L 7/089* (2006.01)
*H03L 7/081* (2006.01)
(Continued)

(52) U.S. Cl.
CPC ............ *H03L 7/0891* (2013.01); *G01S 7/352* (2013.01); *G01S 7/40* (2013.01); *G01S 7/4021* (2013.01); *G01S 13/343* (2013.01); *H03B 5/04* (2013.01); *H03B 5/1215* (2013.01); *H03F 1/0205* (2013.01); *H03F 1/32* (2013.01); *H03F 3/10* (2013.01); *H03F 3/19* (2013.01); *H03F 3/45475* (2013.01); *H03F 3/45636* (2013.01); *H03H 7/06* (2013.01); *H03L 7/0816* (2013.01); *H03L 7/0818* (2013.01); *H03L 7/099* (2013.01);
(Continued)

(58) Field of Classification Search
CPC ........ H03B 5/04; H03B 5/1215; H03L 7/0891
USPC ...................................... 331/8, 182
See application file for complete search history.

(56) References Cited

U.S. PATENT DOCUMENTS 6,317,008 B1 * 11/2001 Gabara ................ H03J 3/20
331/113 R
7,557,664 B1 * 7/2009 Wu ................ H03B 19/14
327/115
(Continued)

Primary Examiner — Joseph Chang
(74) Attorney, Agent, or Firm — Winston Hsu

(57) ABSTRACT

An oscillating circuit has an injection-locked oscillator (ILO) and a calibration circuit. The ILO has a Gm cell and an LC tank. A first node of the Gm cell receives a first injection signal, and a second node of the Gm cell receives a second injection signal. The first injection signal and the second injection signal are differential signals. The Gm cell provides a negative resistance between a first output end and a second output end of the Gm cell. When the calibration circuit tunes a resonant frequency of the LC tank of the ILO, the magnitude of the negative resistance is reduced to control the ILO to stop self-oscillating. After finishing tuning the resonant frequency of the LC tank, the calibration circuit controls the ILO to start self-oscillating by increasing the magnitude of the negative resistance.

18 Claims, 15 Drawing Sheets

(51) Int. Cl.
- *H03L 7/16* (2006.01)
- *G01S 7/35* (2006.01)
- *G01S 7/40* (2006.01)
- *G01S 13/34* (2006.01)
- *H03B 5/04* (2006.01)
- *H03B 5/12* (2006.01)
- *H03H 7/06* (2006.01)
- *H03L 7/099* (2006.01)
- *H03F 1/32* (2006.01)
- *H03F 3/19* (2006.01)
- *H03F 3/45* (2006.01)
- *H04B 1/18* (2006.01)
- *H03F 1/02* (2006.01)
- *H03F 3/10* (2006.01)

(52) U.S. Cl.
CPC ................ *H03L 7/16* (2013.01); *H04B 1/18* (2013.01); *H03B 2200/004* (2013.01); *H03B 2200/0074* (2013.01); *H03B 2201/0208* (2013.01); *H03F 2200/222* (2013.01); *H03F 2200/451* (2013.01); *H03F 2200/513* (2013.01); *H03F 2203/45156* (2013.01); *H03F 2203/45544* (2013.01); *H03F 2203/45631* (2013.01)

(56) References Cited

U.S. PATENT DOCUMENTS

| | | | |
|---|---|---|---|
| 7,710,210 B2 * | 5/2010 | Casper | G01R 31/31726 327/311 |
| 2012/0274409 A1 * | 11/2012 | Eldesouki | H03B 5/1228 331/109 |
| 2015/0200627 A1 * | 7/2015 | Valdes-Garcia | G06F 17/5063 331/8 |

* cited by examiner

OSCILLATING CIRCUIT AND METHOD FOR CALIBRATING A RESONANT FREQUENCY OF AN LC TANK OF AN INJECTION-LOCKED OSCILLATOR (ILO) OF THE OSCILLATING CIRCUIT WHILE STOPPING SELF-OSCILLATION OF THE ILO

CROSS REFERENCE TO RELATED APPLICATIONS

This application claims the benefit of U.S. Provisional Application No. 62/656,999, filed on Apr. 13, 2018, the contents of which are incorporated herein in their entirety.

BACKGROUND OF THE INVENTION

1. Field of the Invention

The present invention relates to an oscillating circuit and a method for calibrating an oscillation frequency of the oscillating circuit, and more particularly, to an oscillating circuit and a method for calibrating a resonant frequency of an LC tank of an injection-locked oscillator (ILO) of the oscillating circuit while stopping self-oscillation of the ILO.

2. Description of the Prior Art

An injection-locked oscillator (ILO) is an oscillator whose oscillation frequency can be locked to a frequency of an external injection signal rather than to its inherent resonance frequency, or free-running frequency. ILOs are usually based on cross-coupled transistors and tank circuits, and have been employed for frequency division. However, due to process, voltage, and temperature (PVT) variations, ILOs are generally unable to generate desirable oscillation frequencies. Therefore, circuits for calibrating the oscillation frequencies of the ILOs are required.

SUMMARY OF THE INVENTION

An embodiment of the present invention discloses an oscillating circuit. The oscillating circuit comprises an injection-locked oscillator (ILO) and a calibration circuit. The ILO comprises a Gm cell and an LC tank. A first node of the Gm cell receives a first injection signal, and a second node of Gm cell receives a second injection signal. The first injection signal and the second injection signal are differential signals. The Gm cell provides a negative resistance between a first output end and a second output end of the Gm cell. The LC tank comprises a first inductor, a first capacitor and a second inductor. A first end of the first inductor is coupled to the second output end, and a second end of the first inductor is coupled to the first output end. A first end of the first capacitor is coupled to the second output end and the first end of the first inductor, and a second end of the first capacitor is coupled to the first output end and the second end of the first inductor. The second inductor is magnetically coupled to the first inductor to generate an output voltage. The calibration circuit is coupled to the LC tank and is configured to tune a resonant frequency of the LC tank to a specific frequency of the first injection signal and the second injection signal. The calibration circuit is further configured to control the ILO to stop self-oscillating by reducing the magnitude of the negative resistance while tuning the resonant frequency of the LC tank.

Another embodiment of the present invention discloses a method of calibrating an oscillating circuit. The oscillating circuit comprises an injection-locked oscillator (ILO) having a Gm cell and an LC tank. A first node of the Gm cell receives a first injection signal, and a second node of the Gm cell receives a second injection signal. The first injection signal and the second injection signal are differential signals. The Gm cell provides a negative resistance between a first output end and a second output end of the Gm cell. The LC tank comprises a first inductor, a first capacitor, and a second inductor. A first end of the first inductor is coupled to the second node, and a second end of the first inductor is coupled to the first node. A first end of the first capacitor is coupled to the second node and the first end of the first inductor, and a second end of the first capacitor is coupled to the first node and the second end of the first inductor. The method comprises tuning a resonant frequency of the LC tank to a specific frequency of the first injection signal and the second injection signal; and controlling the ILO to stop self-oscillating by reducing the magnitude of the negative resistance while tuning the resonant frequency of the LC tank.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
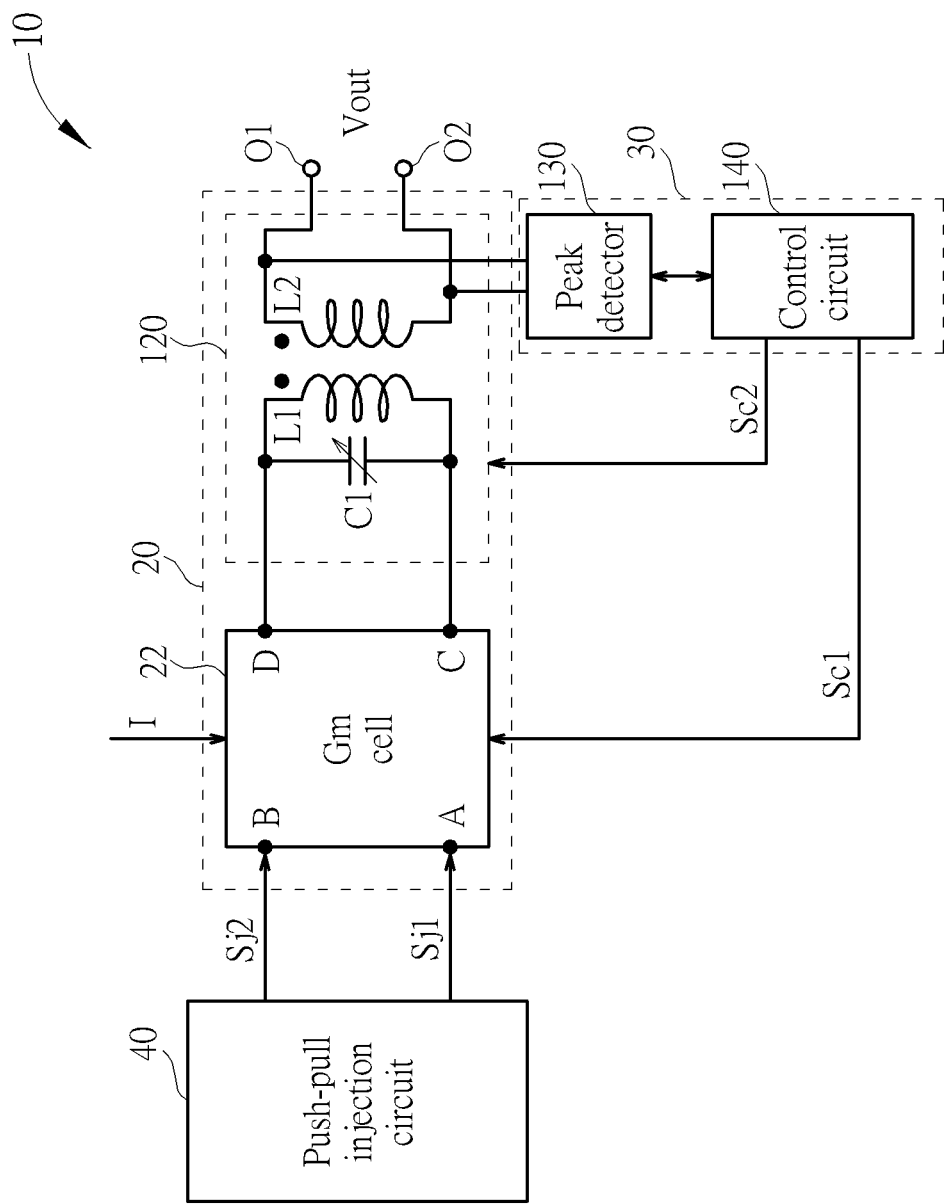
FIG. 1 and FIG. 2 are schematic diagrams of an oscillating circuit according to a first embodiment of the present invention.
Figure 2:
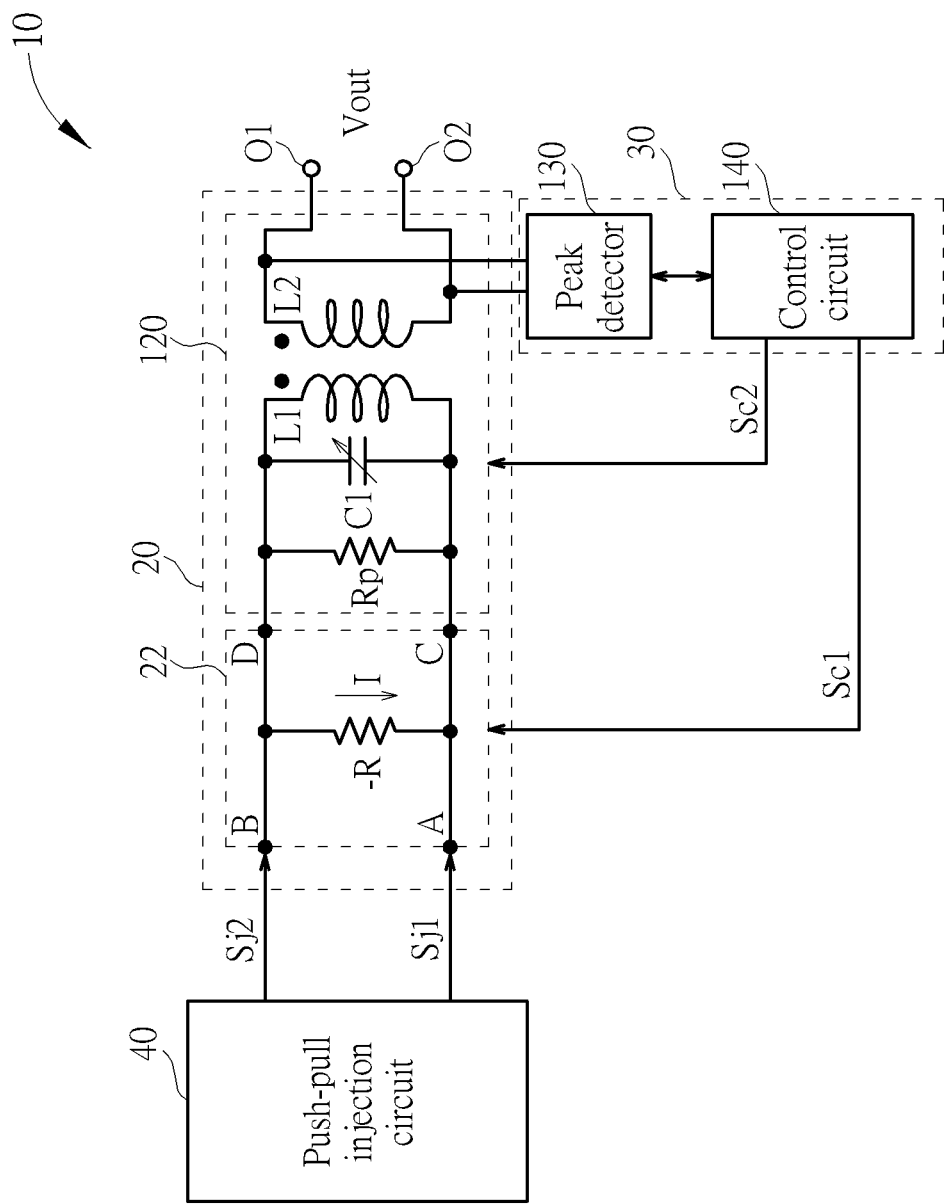

Please refer to FIG. 1 and FIG. 2. FIG. 1 is a schematic diagram of an oscillating circuit 10 according to a first embodiment of the present invention. FIG. 2 is also a schematic diagram of the oscillating circuit 10 while a block of a Gm cell 22 of the oscillating circuit 10 shown in FIG. 1 is represented by an equivalent circuit of the Gm cell 22 in FIG. 2. The oscillating circuit 10 comprises an injection-locked oscillator (ILO) 20 and a calibration circuit 30. The ILO comprises a first node A, a second node B, the Gm cell 22, and an LC tank 120. The first node A receives a first injection signal Sj1, and the second node B receives a second injection signal Sj2. The first injection signal Sj1 and the second injection signal Sj2 are differential signals. In other words, the first injection signal Sj1 and the second injection signal Sj2 are complementary to each other. The LC tank 120 comprises a capacitor C1, a first inductor L1 and a second inductor L2. A first end of the first inductor L1 and a first end of the capacitor C1 are coupled to the second node B, and a second end of the first inductor L1 and a second end of the capacitor C1 are coupled to the first node A. The second inductor L2 is magnetically coupled to the first inductor L1 for generating an output voltage Vout. As shown in FIG. 1, the output voltage Vout is a voltage difference between two output ends O1 and O2 of the second inductor L2. A transformer ratio of the inductors L1 and L2 may be 1:N, where the parameter is a positive number. For example, the parameter N may be 0.5, 1, 1.5, 2, 3, or another positive number. If the transformer ratio of the inductors L1 and L2 is 1:1, a frequency of the output voltage Vout would be equal to the resonant frequency of the LC tank 120. The Gm cell 22 is an active transconductance element and provides a negative resistance −R between a first output end C and a second output end D of the Gm cell so as to compensate energy losses of the LC tank 120 resulted from both parasitic resistance and capacitance of the LC tank 120. As shown in FIG. 2, the equivalent circuit of the Gm cell 22 has parasitic resistance Rp. When an absolute value of the negative resistance −R is less than the parasitic resistance Rp (i.e., |−R|<Rp), the Gm cell 22 is at a buffer mode, and the first injection signal Sj1 and the second injection signal Sj2 would pass through the Gm cell to the LC tank 120. When the absolute value of the negative resistance |−R| is greater than the parasitic resistance Rp (i.e., |−R|>Rp), the Gm cell 22 is at an oscillation mode, and the ILO 20 would self-oscillates due to the first injection signal Sj1 and the second injection signal Sj2.

The calibration circuit 30 is coupled to the LC tank 120 to tune a resonant frequency of the LC tank 120 to a specific frequency of the first injection signal Sj1 and the second injection signal Sj2. The resonant frequency of the LC tank 120 could be represented as follows:

$$f = \frac{1}{2\pi\sqrt{L_1 \times C_1}}$$

where f is the resonant frequency of the LC tank 120; $L_1$ is the inductance of the first inductor L1; and $C_1$ is the capacitance of the capacitor C1.

While tuning the resonant frequency of the LC tank 120, the calibration circuit 30 transmits a control circuit Sc2 to the LC tank 120 to adjust capacitance of the capacitor C1 and/or the inductance of the first inductor L1. In an embodiment of the present invention, the capacitor C1 is a tunable capacitor, and the calibration circuit 30 tunes the resonant frequency $$\left(\text{i.e., } \frac{1}{2\pi\sqrt{L_1 \times C_1}}\right)$$

of the LC tank 120 to the specific frequency of the injection signals Sj1 and Sj2 by adjusting the capacitance of the capacitor C1.

In addition, while tuning the resonant frequency of the LC tank 120, the calibration circuit 30 transmits another control signal Sc1 to the Gm cell 22 to reduce the magnitude of the negative resistance −R (i.e., to decrease the absolute value of the negative resistance |−R|) so as to control the ILO 20 to stop self-oscillating. When the magnitude of the negative resistance −R is reduced, a current I flowing through the Gm cell 22 is decreased. When the absolute value of the negative resistance |−R| is small enough (i.e., |−R|<Rp), the current I becomes insufficient for supporting self-oscillation of the ILO 20. Accordingly, the ILO 20 stops self-oscillating, and the Gm cell 22 operates like a buffer due to the reduced magnitude of the negative resistance |−R| and the insufficient current I. As a result, the first injection signal Sj1 and the second injection signal Sj2 would pass through the Gm cell 22 to be directly injected into the LC tank 120 when the ILO 20 stops self-oscillating.

When finishing tuning the resonant frequency of the LC tank 120 to the specific frequency of the injection signals Sj1 and Sj2, the calibration circuit 30 increases the magnitude of the negative resistance −R (i.e., let |−R|>Rp) to control the ILO 20 to start self-oscillating. Accordingly, an oscillation frequency of the ILO 20 (i.e., the resonant frequency of the LC tank 120) would be injection-locked to the specific frequency of the injection signals Sj1 and Sj2 so as to complete calibration of the resonant frequency of the LC tank 120 (i.e., calibration of the oscillation frequency of the ILO 20).

In an embodiment of the present invention, the calibration circuit 30 may comprise a peak detector 130 and a control circuit 140. The peak detector 130 is configured to detect a peak of swing of the output voltage Vout. Before finishing tuning the resonant frequency of the LC tank 120 to the specific frequency of the injection signals Sj1 and Sj2, it is very difficult for the peak detector 130 to detect the peak of the swing of the output voltage Vout. Therefore, when the peak of the swing of the output voltage Vout is detected by the peak detector 130, indicating that the calibration circuit 30 has finished tuning the resonant frequency of the LC tank 120 to the specific frequency of the injection signals Sj1 and Sj2. Accordingly, the control circuit 140 could tune the resonant frequency of the LC tank 120 based on the peak detected by the peak detector 130. If the peak of the swing of the output voltage Vout has not been detected by the peak detector 130, the control circuit 140 would continue tuning the resonant frequency of the LC tank 120 until the peak is detected.

In an embodiment, the first inductor L1 and the second inductor L2 are high-quality (high-Q) inductors (i.e., a transformer consisted of the two inductors L1 and L2 is a high-Q transformer), so the power of the ILO 20 may be saved to reduce power consumption of the oscillating circuit 10. Moreover, since transformer consisted of the two inductors L1 and L2 is a high-Q transformer, the bandwidth of the LC tank 120 is very narrow. However, by tuning the capacitance of the capacitor C1 and/or the inductance of the first inductor L1 when reducing the magnitude of the negative resistance −R to stop self-oscillation of the ILO 20, the resonant frequency of the LC tank 120 could be accurately calibrated at the specific frequency of the injection signals Sj1 and Sj2. Therefore, the oscillation frequency of the ILO 20 would be injection-locked at the specific frequency of the injection signals Sj1 and Sj2 when the ILO 20 starts to self-oscillate.

In an embodiment of the present invention, the oscillating circuit 10 may further comprise a push-pull injection circuit 40 for injecting the injection signals Sj1 and Sj2 into the ILO 20. Since the injection signals Sj1 and Sj2 are two differential signals, a voltage level of the first node A is pushed up while a voltage level of the second node B is pulled down; and the voltage level of the first node A is pulled down while the voltage level of the second node B is pushed up. In other words, when the injection signal Sj1 is pushing-injected into the first node A, the injection signal Sj2 is pulling-injected into the second node B. When the injection signal Sj1 is pulling-injected into the first node A, the injection signal Sj2 is pushing-injected into the second node B.

Figure 3:
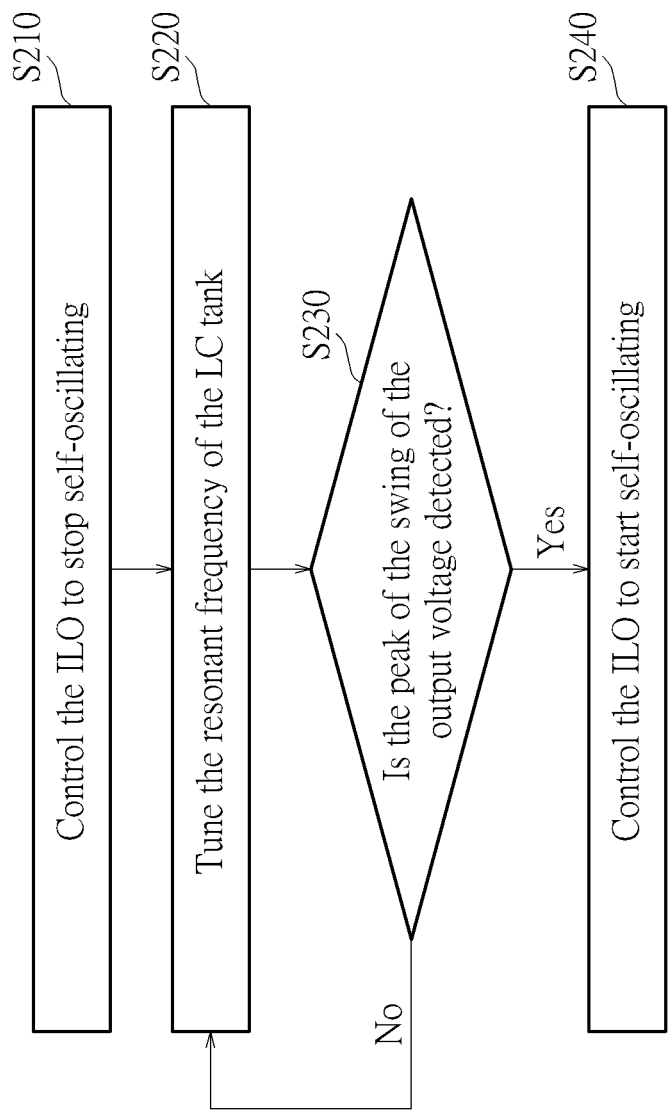
FIG. 3 is a flow chart of a method for calibrating a resonant frequency of an LC tank of an injection-locked oscillator (ILO) of the oscillating circuit shown in FIG. 1 according to an embodiment of the present invention.

Please refer to FIG. 3. FIG. 3 is a flow chart of a method for calibrating the resonant frequency of the LC tank 120 according to an embodiment of the present invention. The method comprises the following steps:

Step S210: The control circuit 140 controls the ILO 20 to stop self-oscillating by reducing the magnitude of the negative resistance |−R|;

Step S220: The control circuit 140 tunes the resonant frequency of the LC tank 120 by adjusting the capacitance of the capacitor C1 and/or the inductance of the first inductor L1;

Step S230: The control circuit 140 determines whether the peak of the swing of the output voltage Vout is detected by the peak detector 130; if so, perform step S240; else repeat step S220; and Step S240: The control circuit 140 controls the ILO 20 to start self-oscillating so as to injection-lock the oscillation frequency of the ILO 20 (i.e., the resonant frequency of the LC tank 120) to the specific frequency of the injection signals Sj1 and Sj2.

Figure 4:
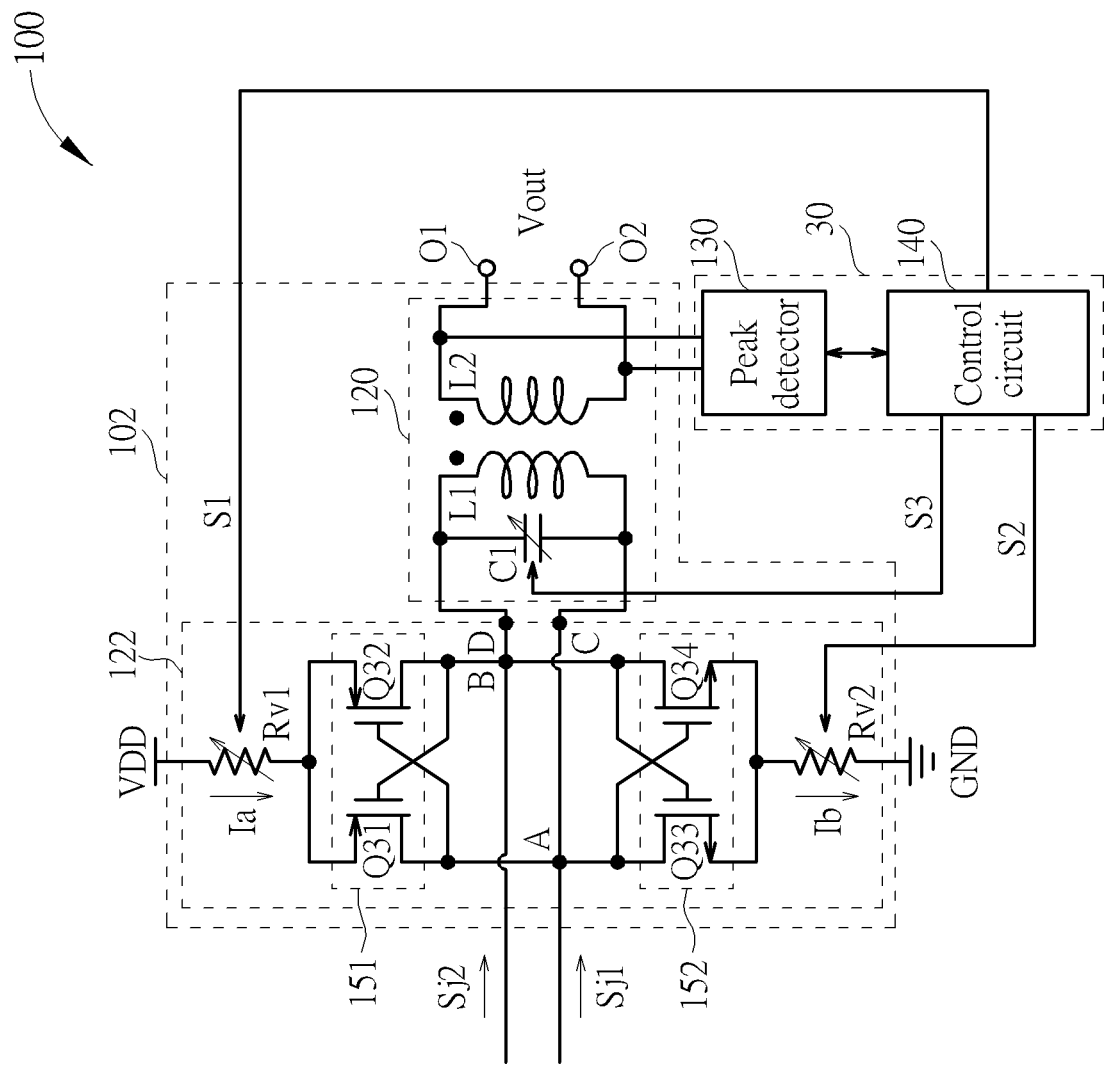
FIG. 4 is a circuit diagram of an oscillating circuit according to a second embodiment of the present invention.

Please refer to FIG. 4. FIG. 4 is a circuit diagram of an oscillating circuit 100 according to a second embodiment of the present invention. The main difference between the two oscillating circuits 10 and 100 is that the Gm cell 22 of the oscillating circuit 10 is implemented by a Gm cell 122 of the oscillating circuit 100. The Gm cell 122 is also used to provide the negative resistance −R between the first output end C and the second output end D. In the embodiment, the first output end C is directly coupled to the first node A, and the second output end D is directly coupled to the second node B. The Gm cell 122 comprises a first variable resistor Rv1, a pair 151 of P-type metal-oxide-semiconductor (PMOS) transistors Q31 and Q32, a second variable resistor Rv2, and a pair 152 of N-type metal-oxide-semiconductor (NMOS) transistors Q33 and Q34. A first end of the first variable resistor Rv1 is coupled to a first supply voltage VDD. The two PMOS transistors Q31 and Q32 are cross coupled. The source of the PMOS transistor Q31 is coupled to a second end of the first variable resistor Vrl, the drain of the PMOS transistor Q31 is coupled to the first node A, and the gate of the PMOS transistor Q31 is coupled to the second node B. The source of the PMOS transistor Q32 is coupled to the second end of the first variable resistor Rv1, the drain of the PMOS transistor Q32 is coupled to the second node B, and the gate of the PMOS transistor Q32 is coupled to the first node A. A second end of the second variable resistor Rv2 is coupled to a second supply voltage GND. The second supply voltage GND may be a ground voltage. The two NMOS transistors Q33 and Q34 are cross coupled. The source of the NMOS transistor Q33 is coupled to a first end of the second variable resistor Rv2, the drain of the NMOS transistor Q33 is coupled to the first node A, and the gate of the NMOS transistor Q33 is coupled to the second node B. The source of the NMOS transistor Q34 is coupled to the first end of the second variable resistor Rv2, the drain of the NMOS transistor Q34 is coupled to the second node B, and the gate of the NMOS transistor Q34 is coupled to the first node A.

While tuning the resonant frequency of the LC tank 120 of an ILO 102 of the oscillating circuit 100, the calibration circuit 30 transmits a control circuit S3 to the LC tank 120 to adjust capacitance of the capacitor C1 and/or the inductance of the first inductor L1. Moreover, while tuning the resonant frequency of the LC tank 120, the calibration circuit 30 transmits a control signal S1 to the first variable resistor Rv1 and transmits a control signal S2 to the second variable resistor Rv2 so as to increase resistance of the first variable resistor Rv1 and resistance of the second variable resistor Rv2. As a result, the magnitude of the negative resistance −R (i.e., the absolute value of the negative resistance |−R|) is reduced due to the increasing resistance of the two variable resistors Rv1 and Rv2. When the absolute value of the negative resistance |−R| is small enough (i.e., |−R|<Rp), a current Ia through the first variable resistor Rv1 and a current Ib through the second variable resistor Rv2 become insufficient for supporting the self-oscillation of the ILO 102. Accordingly, the ILO 102 stops self-oscillating, and the Gm cell 122 operates like a buffer due to the reduced magnitude of the negative resistance |−R| and the insufficient currents Ia and Ib. As a result, the first injection signal Sj1 and the second injection signal Sj2 would pass through the Gm cell 122 to be directly injected into the LC tank 120 when the ILO 102 stops self-oscillating. Then, the calibration circuit 30 tunes the resonant frequency $$\left(\text{i.e., } \frac{1}{2\pi\sqrt{L_1 \times C_1}}\right)$$

of the LC tank 120 to the specific frequency of the injection signals Sj1 and Sj2 by adjusting the capacitance of the capacitor C1 and/or the inductance of the first inductor L1.

When finishing tuning the resonant frequency of the LC tank 120 to the specific frequency of the injection signals Sj1 and Sj2, the calibration circuit 30 decrease the resistance of the first variable resistor Rv1 and the resistance of the second variable resistor Rv2 to increase the currents Ia and Ib. As a result, the magnitude of the negative resistance |−R| is increased to control the ILO 102 to start self-oscillating. Accordingly, an oscillation frequency of the ILO 102 would be injection-locked to the specific frequency of the injection signals Sj1 and Sj2 so as to complete calibration of the resonant frequency of the LC tank 120. Since the resonant frequency of the LC tank 120 could be accurately calibrated to be very close to the specific frequency of the injection signals Sj1 and Sj2, even if the bandwidth of the LC tank 120 is very narrow, the oscillation frequency of the ILO 102 would be injection-locked at the specific frequency of the injection signals Sj1 and Sj2 when tuning the resonant frequency of the LC tank 120 is finished and the ILO 102 starts to self-oscillate.

In another embodiment of the present invention, each of the two variable resistors Rv1 and Rv2 may be replaced by a current source (i.e., another current element). More particularly, the first variable resistor Rv1 may be replaced by a first current source that provides the current Ia, and the second variable resistor Rv2 may be replaced by a second current source that provides the current Ib. When tuning the resonant frequency of the LC tank 120, the calibration circuit 30 transmits the control signal S1 to the first current source and transmits the control signal S2 to the second current source so as to decrease the currents Ia and Ib. When finishing tuning the resonant frequency of the LC tank 120 to the specific frequency of the injection signals Sj1 and Sj2, the calibration circuit 30 increases the currents Ia and Ib to increase the magnitude of the negative resistance |−R| so as to control the ILO 102 to start self-oscillating.

Figure 5:
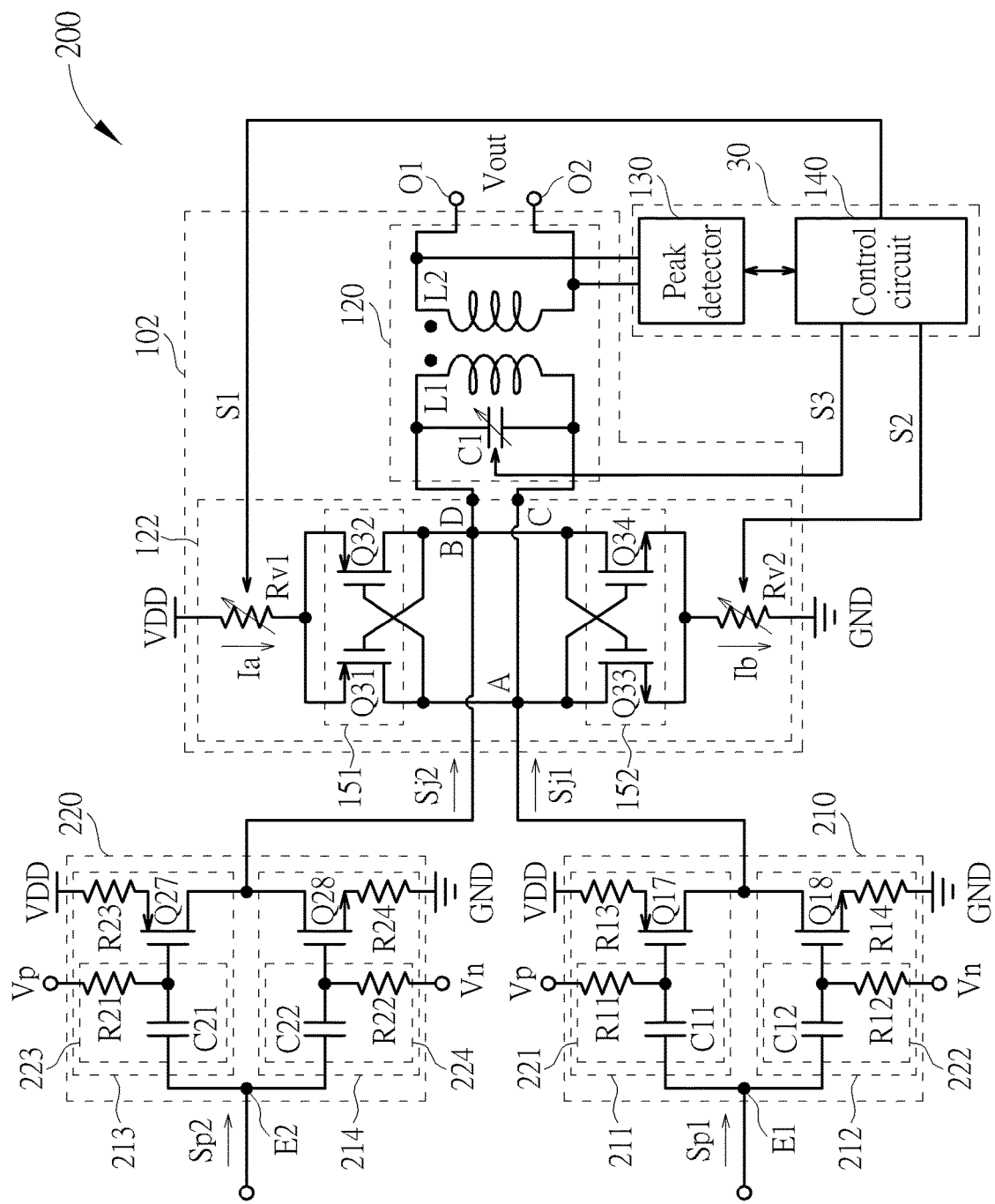
FIG. 5 is a circuit diagram of an oscillating circuit according to a third embodiment of the present invention.

Please refer to FIG. 5. FIG. 5 is a circuit diagram of an oscillating circuit 200 according to a third embodiment of the present invention. The main difference between the two oscillating circuits 100 and 200 is that the oscillating circuit 200 further comprises a first push-pull injection circuit 210 and a second push-pull injection circuit 220. The first push-pull injection circuit 210 is configured to generate and output the first injection signal Sj1 to the first node A of the ILO 102, and the second push-pull injection circuit 220 is configured to generate and output the second injection signal Sj2 to the second node B of the ILO 102. Since the first injection signal Sj1 and the second injection signal Sj2 are two differential signals, a voltage level of the first node A is pushed up while a voltage level of the second node B is pulled down. The voltage level of the first node A is pulled down while the voltage level of the second node B is pushed up.

The first push-pull injection circuit 210 comprises a first input node E1, a first falling injection circuit 211, and a first rising injection circuit 212. The first input node E1 is used to receive a first reference signal Sp1. The first falling injection circuit 211 is used to inject the first injection signal Sj1 into the first node A when the first reference signal Sp1 is at a falling edge. The first falling injection circuit 211 comprises a resistor R13, a PMOS transistor Q17, and a first high pass filter 221. A first end of the resistor R13 is coupled to the first supply voltage VDD, a source of the PMOS transistor Q17 is coupled to a second end of the resistor R13, a drain of the PMOS transistor Q17 is coupled to the first node A of the ILO 102, and the first high pass filter 221 is coupled between the first input node E1 and a gate of the PMOS transistor Q17. The first high pass filter 221 is used to filter out direct-current (DC) component of the first reference signal Sp1. The first high pass filter 221 comprises a resistor R11 and a capacitor C11. The resistor R11 is coupled between a first bias voltage Vp and the gate of the PMOS transistor Q17, and the capacitor C11 is coupled between the first input node E1 and the gate of the PMOS transistor Q17. The first bias voltage Vp is a relative high voltage, which may be equal to or unequal to the first supply voltage VDD. The first rising injection circuit 212 is used to inject the first injection signal Sj1 into the first node A when the first reference signal Sp1 is at a rising edge. The first rising injection circuit 212 comprises a resistor R14, an NMOS transistor Q18, and a second high pass filter 222. A second end of the resistor R14 is coupled to the second supply voltage GND, a source of the NMOS transistor Q18 is coupled to a first end of the resistor R14, a drain of the NMOS transistor Q18 is coupled to the first node A of the ILO 102, and the second high pass filter 222 is coupled between the first input node E1 and a gate of the NMOS transistor Q18. The second high pass filter 222 is also used to filter out the DC component of the first reference signal Sp1. The second high pass filter 222 comprises a resistor R12 and a capacitor C12. The resistor R12 is coupled between a second bias voltage Vn and the gate of the NMOS transistor Q18, and the capacitor C12 is coupled between the first input node E1 and the gate of the NMOS transistor Q18. The second bias voltage Vn is a relative low voltage, which may be equal to or unequal to the second supply voltage GND.

Similarly, the second push-pull injection circuit 220 comprises a second input node E2, a second falling injection circuit 213, and a second rising injection circuit 214. The second input node E2 is used to receive a second reference signal Sp2. The first reference signal Sp1 and the second reference signal Sp2 are two differential signals (i.e., are complementary to each other). The second falling injection circuit 213 is used to inject the second injection signal Sj2 into the second node B when the second reference signal Sp2 is at a falling edge. The second falling injection circuit 213 comprises a resistor R23, a PMOS transistor Q27, and a third high pass filter 223. A first end of the resistor R23 is coupled to the first supply voltage VDD, a source of the PMOS transistor Q27 is coupled to a second end of the resistor R23, a drain of the PMOS transistor Q27 is coupled to the second node B of the ILO 102, and the third high pass filter 223 is coupled between the second input node E2 and a gate of the PMOS transistor Q27. The third high pass filter 223 is used to filter out DC component of the second reference signal Sp2. The third high pass filter 223 comprises a resistor R21 and a capacitor C21. The resistor R21 is coupled between the first supply voltage VDD and the gate of the PMOS transistor Q27, and the capacitor C21 is coupled between the second input node E2 and the gate of the PMOS transistor Q27. The second rising injection circuit 214 is used to inject the second injection signal Sj2 into the second node B when the second reference signal Sp2 is at a rising edge. The second rising injection circuit 214 comprises a resistor R24, an NMOS transistor Q28, and a fourth high pass filter 224. A second end of the resistor R24 is coupled to the second supply voltage GND, a source of the NMOS transistor Q28 is coupled to a first end of the resistor R24, a drain of the NMOS transistor Q28 is coupled to the second node B of the ILO 102, and the fourth high pass filter 224 is coupled between the second input node E2 and a gate of the NMOS transistor Q28. The fourth high pass filter 224 is also used to filter out the DC component of the second reference signal Sp2. The fourth high pass filter 224 comprises a resistor R22 and a capacitor C22. The resistor R22 is coupled between the second supply voltage GND and the gate of the NMOS transistor Q28, and the capacitor C22 is coupled between the second input node E2 and the gate of the NMOS transistor Q28.

Figure 6:
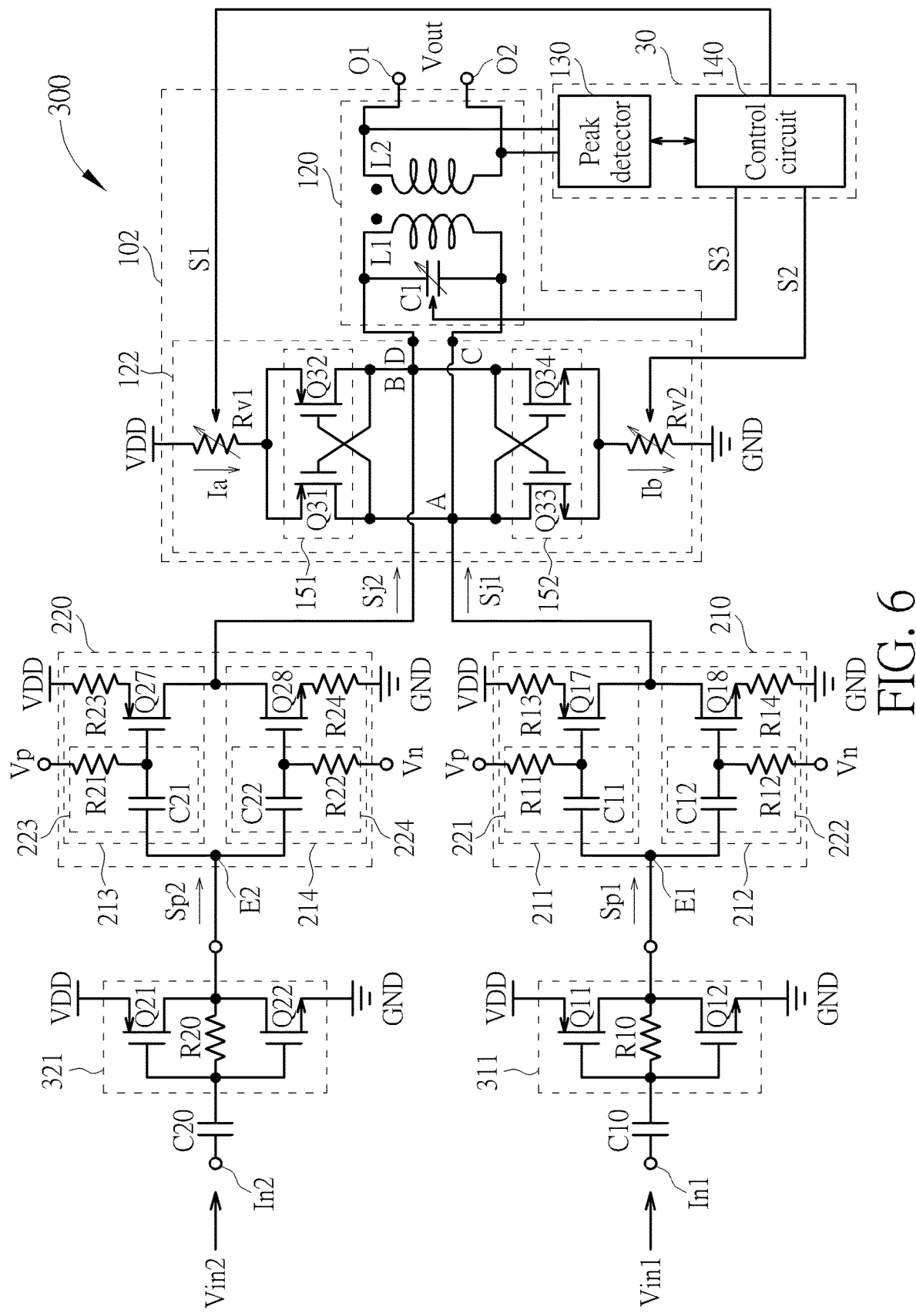
FIG. 6 is a circuit diagram of an oscillating circuit according to a fourth embodiment of the present invention.

Please refer to FIG. 6. FIG. 6 is a circuit diagram of an oscillating circuit 300 according to a fourth embodiment of the present invention. The main difference between the two oscillating circuits 200 and 300 is that the oscillating circuit 300 further comprises a first main input end In1, a second main input In2, two inverters 311 and 321, two capacitors C10 and C20, and two feedback resistors R10 and R20. The first main input end In1 is configured to receive a first clock signal Vin1, and the second main input end In2 is configured to receive a second clock signal Vin2. The first clock signal Vin1 and the second clock signal Vin2 are complementary to each other. A first end of the capacitor C10 is coupled to the first main input end In1, a second end of the capacitor C10 is coupled to an input end of the inverter 311, and the feedback resistor R10 is coupled between the input end and an output end of the inverter 311. The output end of the inverter 311 is also coupled to the first input node E1 of the first push-pull injection circuit 210. The inverter 311 inverts the first clock signal Vin1 to generate and output the first reference signal Sp1. The inverter 311 may comprise a PMOS transistor Q11 and an NMOS transistor Q12. Similarly, a first end of the capacitor C20 is coupled to the second main input end In2, a second end of the capacitor C20 is coupled to an input end of the inverter 321, and the feedback resistor R20 is coupled between the input end and output end of the inverter 321. The output end of the inverter 321 is also coupled to the second input node E2 of the second push-pull injection circuit 220. The inverter 321 inverts the second clock signal Vin2 to generate and output the second reference signal Sp2. The inverter 321 may comprise a PMOS transistor Q21 and an NMOS transistor Q22.

Figure 7:
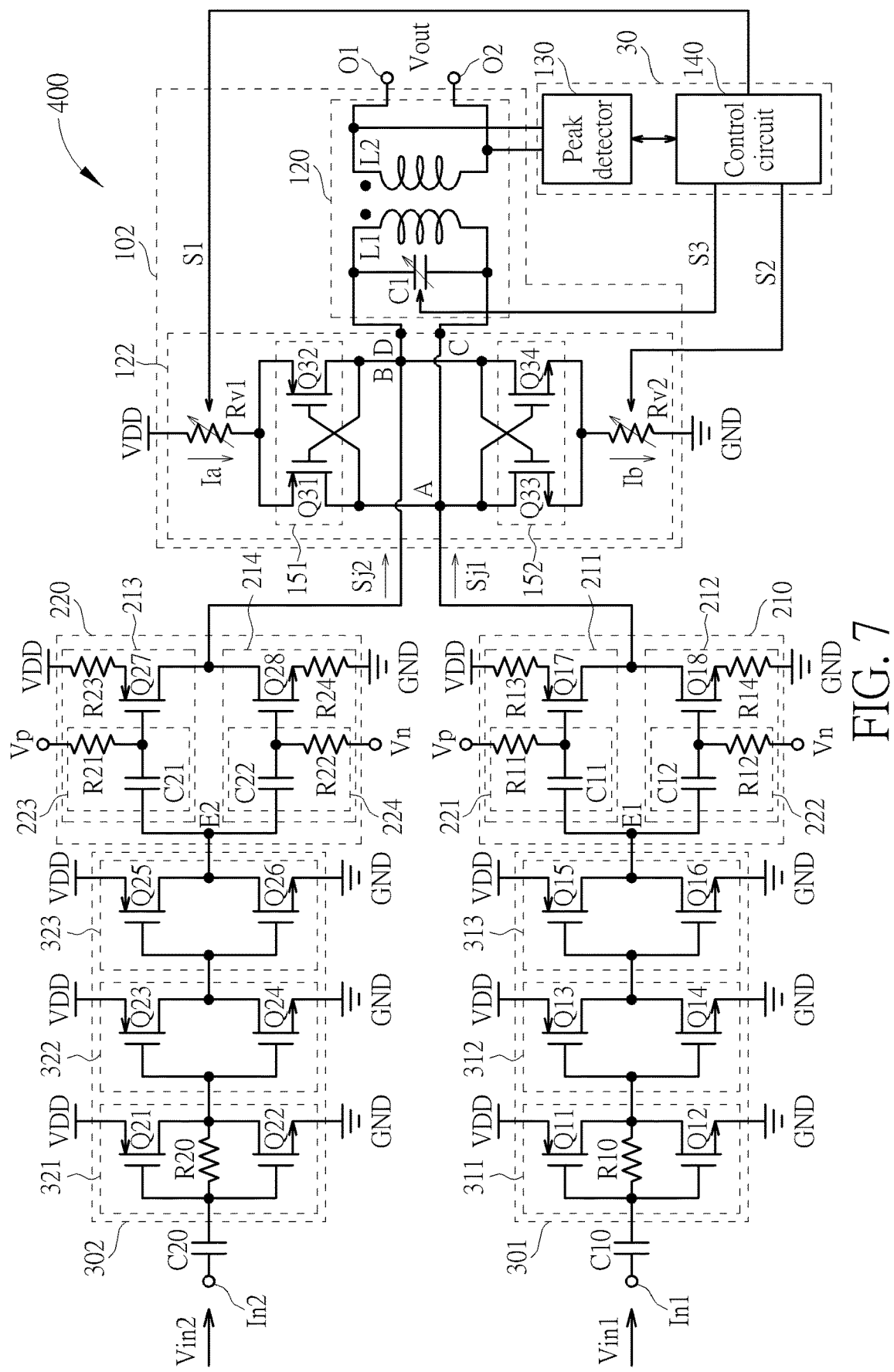
FIG. 7 is a circuit diagram of an oscillating circuit according to a fifth embodiment of the present invention.

Please refer to FIG. 7. FIG. 7 is a circuit diagram of an oscillating circuit 400 according to a fifth embodiment of the present invention. The main difference between the two oscillating circuits 200 and 400 is that the oscillating circuit 400 further comprises the first main input end In1, the second main input end In2, the two capacitors C10 and C20, the two feedback resistors R10 and R20, a first inverter chain 301, and a second inverter chain 302. The first inverter chain 301 comprises a plurality of inverters 311 to 313, and the second inverter chain 302 comprises a plurality of inverters 321 to 323. Each of the inverters 311 to 313 and 321 to 323 has a PMOS transistor (e.g., Q11, Q13, Q15, Q21, Q23 or Q25) and an NMOS transistor (e.g., Q12, Q14, Q16, Q22, Q24 or Q26). An input end of the first inverter chain 301 is coupled to the second end of the capacitor C10, and an output end of the first inverter chain 301 is coupled to the first input node E1 of the first push-pull injection circuit 210. The first feedback resistor R10 is coupled between the input end of the first inverter chain 301 and an output end of the inverter 311 of the first inverter chain 301. Similarly, an input end of the second inverter chain 302 is coupled to the second end of the capacitor C20, and an output end of the second inverter chain 302 is coupled to the second input node E2 of the second push-pull injection circuit 220. The second feedback resistor R20 is coupled between the input end of the second inverter chain 302 and an output end of the inverter 321 of the second inverter chain 302.

It could be noted that the first injection signals Sj1 primarily consists of frequency components that are multiples of the frequency of the first clock signal Vin1 (i.e., harmonics of the frequency of the first clock signal Vin1), and the second injection signals Sj2 primarily consists of frequency components that are multiples of the frequency of the second clock signal Vin2 (i.e., harmonics of the frequency of the second clock signal Vin2). The foresaid specific frequency of the injection signals Sj1 and Sj2 is a harmonic frequency of the first clock signal Vin1 and the second clock signal Vin2. For example, the foresaid specific frequency of the injection signals Sj1 and Sj2 may be a fifth harmonic frequency of the first clock signal Vin1 and the second clock signal Vin2, and the specific frequency of the injection signals Sj1 and Sj2 is five times of the frequency of the first clock signal Vin1 and the second clock signal Vin2. However, the present invention is not limited thereto. The foresaid specific frequency of the injection signals Sj1 and Sj2 may be any one of the harmonic frequencies of the first clock signal Vin1 and the second clock signal Vin2, and the resonant frequency of the LC tank 120 is tuned to the foresaid specific frequency. In this case, the oscillating circuit 400 is an injection-locked frequency multiplier.

Figure 8:
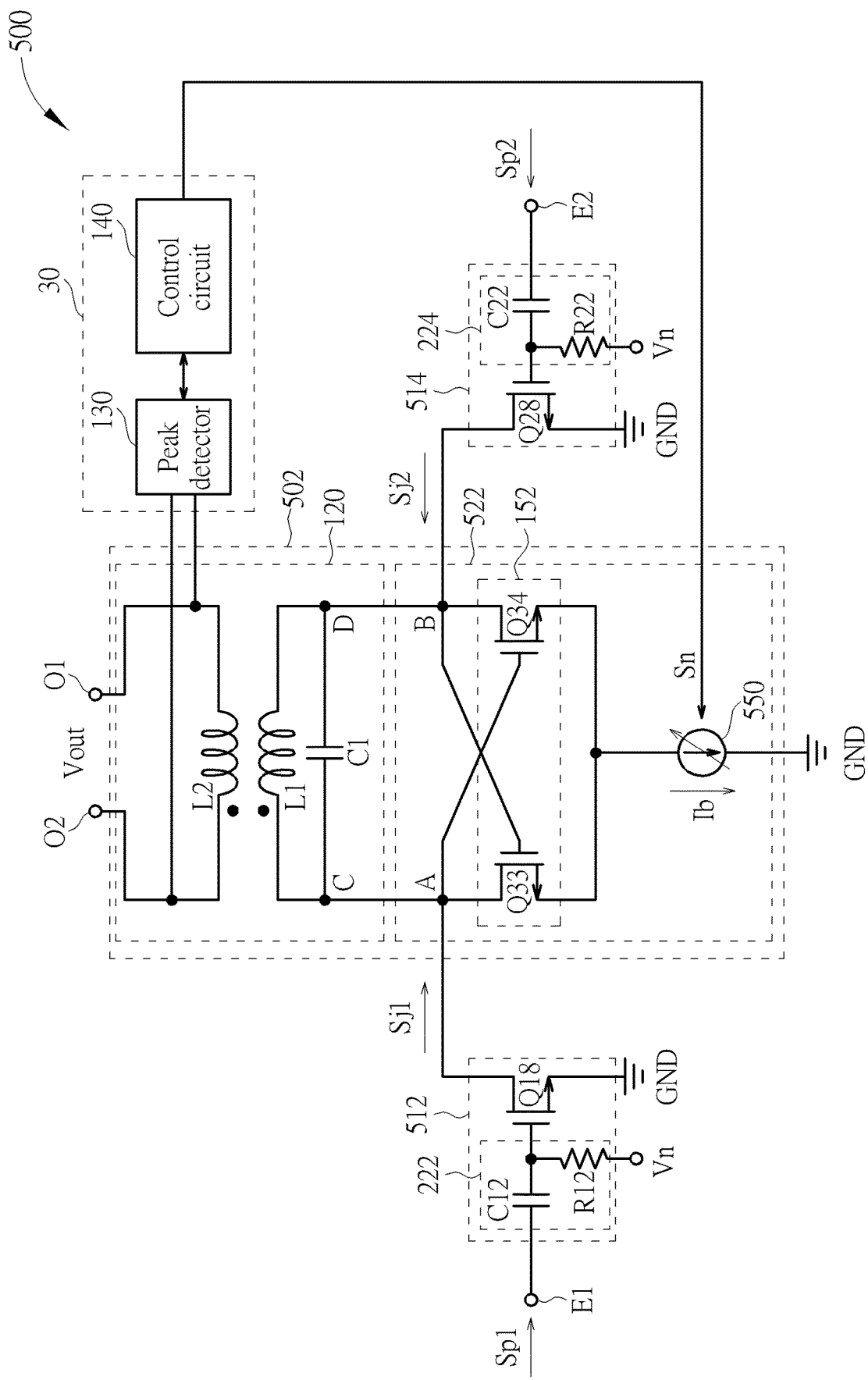
FIG. 8 is a circuit diagram of an oscillating circuit according to a sixth embodiment of the present invention.

In the foresaid embodiments of the present invention, the transistors of the Gm cell 122 of the ILO 102 comprise PMOS transistors and NMOS transistors. However, in some embodiments of the present invention, all of the transistors of the Gm cell of the ILO may be P-type metal-oxide-semiconductor field-effect transistors (PMOSFETs) or N-type metal-oxide-semiconductor field-effect transistors (NMOSFETs). Please refer to FIG. 8. FIG. 8 is a circuit diagram of an oscillating circuit 500 according to a sixth embodiment of the present invention. The main difference between the oscillating circuit 500 in FIG. 8 and the oscillating circuit 200 in FIG. 2 is that all transistors of a Gm cell 522 of an ILO 502 of the oscillating circuit 500 are NMOSFETs. The Gm cell 522 comprises a current source 550 and the pair 152 of the cross coupled NMOSFETs Q33 and Q34. A first end of the current source 550 is coupled to the sources of the two NMOSFETs Q33 and Q34, and a second end of the current source 550 is coupled to the second supply voltage GND. The drain of the NMOSFET Q33 is coupled to the first node A, and the gate of the NMOSFET Q33 is coupled to the second node B. The drain of the NMOSFET Q34 is coupled to the second node B, and the gate of the NMOSFET Q34 is coupled to the first node A. In the embodiment, the first output end C is directly coupled to the first node A, and the second output end D is directly coupled to the second node B. While tuning the resonant frequency of the LC tank 120, the control circuit 140 of the calibration circuit 30 transmits a control signal Sn to the current source 550 to reduce a current Ib following through the current source 550 so as to reduce the magnitude of the negative resistance |−R| to control the ILO 502 to stop self-oscillating. Then, the control circuit 140 of the calibration circuit 30 tunes the resonant frequency $$\left(\text{i.e., } \frac{1}{2\pi\sqrt{L_1 \times C_1}}\right)$$

of the LC tank 120 to the specific frequency of the injection signals Sj1 and Sj2 by adjusting the capacitance of the capacitor C1 and/or the inductance of the first inductor L1. When finishing tuning the resonant frequency of the LC tank 120 to the specific frequency of the injection signals Sj1 and Sj2, the control circuit 140 decrease the current Ib to increase the magnitude of the negative resistance |−R| so as to control the ILO 502 to start self-oscillating. Accordingly, an oscillation frequency of the ILO 502 would be injection-locked to the specific frequency of the injection signals Sj1 and Sj2 so as to complete calibration of the resonant frequency of the LC tank 120. Since the resonant frequency of the LC tank 120 could be accurately calibrated to be very close to the specific frequency of the injection signals Sj1 and Sj2, even if the bandwidth of the LC tank 120 is very narrow, the oscillation frequency of the ILO 502 would be injection-locked at the specific frequency of the injection signals Sj1 and Sj2 when tuning the resonant frequency of the LC tank 120 is finished and the ILO 502 starts to self-oscillate.

The oscillating circuit 500 may further comprises a first rising injection circuit 512 and a second rising injection circuit 514. The first rising injection circuit 512 is used to inject the first injection signal Sj1 into the first node A when the first reference signal Sp1 is at a rising edge. The second rising injection circuit 514 is used to inject the second injection signal Sj2 into the second node B when the second reference signal Sp2 is at a rising edge. The first rising injection circuit 512 comprises the NMOS transistor Q18 and the second high pass filter 222. The source of the NMOS transistor Q18 is directly coupled to the second supply voltage GND. The second high pass filter 222 is also used to filter out the DC component of the first reference signal Sp1 and comprises the resistor R12 and the capacitor C12. The second rising injection circuit 514 comprises the NMOS transistor Q28 and the fourth high pass filter 224. The source of the NMOS transistor Q28 is directly coupled to second supply voltage GND. The fourth high pass filter 224 is also used to filter out the DC component of the second reference signal Sp2 and comprises the resistor R22 and the capacitor C22.

Figure 9:
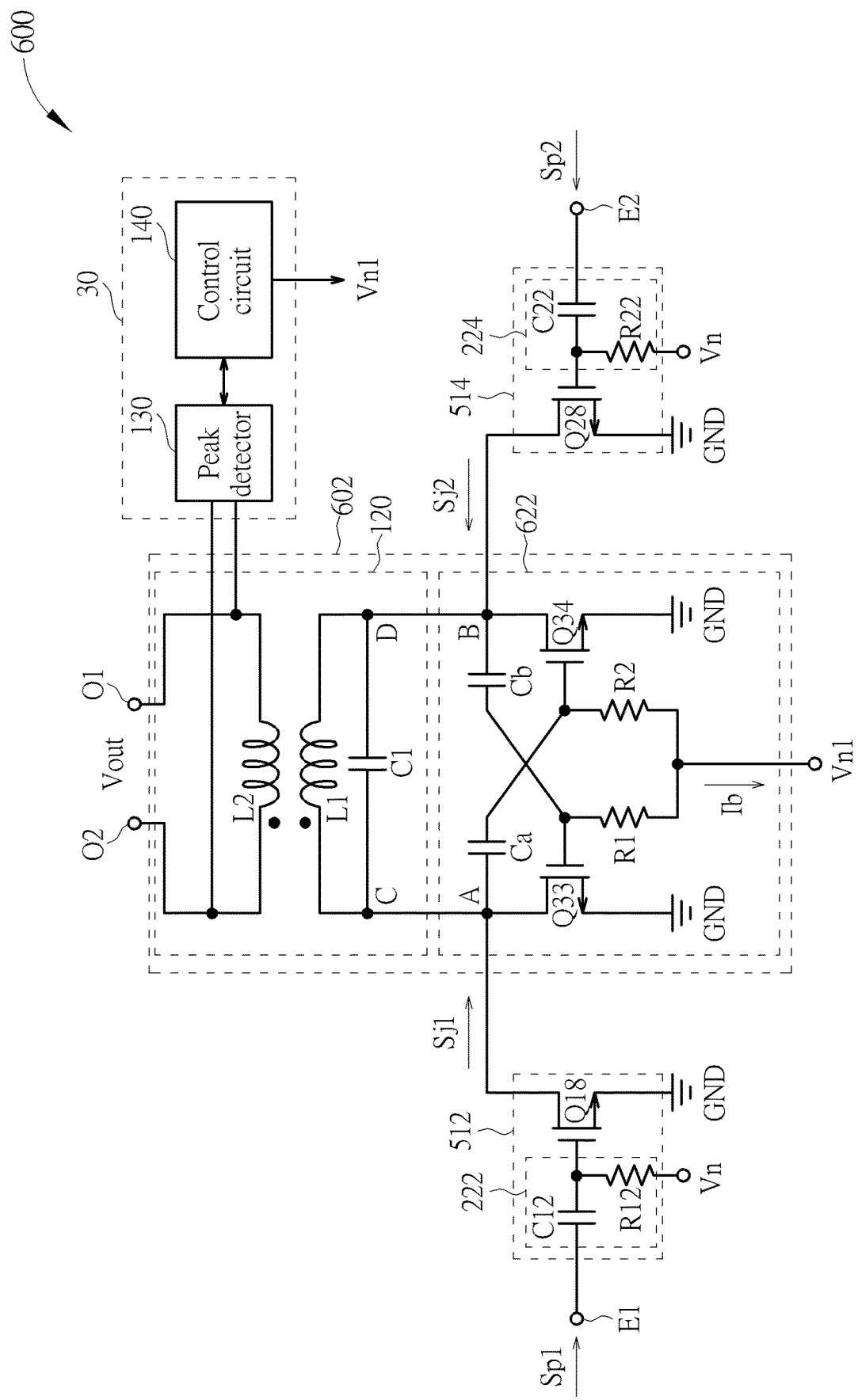
FIG. 9 is a circuit diagram of an oscillating circuit according to a seventh embodiment of the present invention.

Please refer to FIG. 9. FIG. 9 is a circuit diagram of an oscillating circuit 600 according to a seventh embodiment of the present invention. The main difference between the oscillating circuit 600 in FIG. 9 and the oscillating circuit 500 in FIG. 8 is that the Gm cell 522 of the oscillating circuit 500 is replaced by a Gm cell 622 of an ILO 602 of the oscillating circuit 600. The Gm cell 622 comprises two capacitors Ca and Cb, two resistors R1 and R2, and the two NMOSFET Q33 and Q34. A first end of the capacitor Ca is coupled to the first node A, a second end of the capacitor Ca is coupled to a first end of the resistor R2 and the gate of the NMOSFET Q34. A first end of the capacitor Cb is coupled to the second node B, a second end of the capacitor Cb is coupled to the first end of the resistor R1 and the gate of the NMOSFET Q33. The resistor R1 is coupled between the second end of the capacitor Cb and a bias voltage Vn1, and the resistor R2 is coupled between the second end of the capacitor Ca and the bias voltage Vn1. The bias voltage Vn1 is generated by the control circuit 140 based on the peak detected by the peak detector 130. Therefore, the current Ib would be controlled based on the bias voltage Vn1, and the calibration circuit 30 would reduce the magnitude of the negative resistance |−R| by adjusting a voltage level of the bias voltage Vn1. The source of the NMOSFET Q33 is coupled to the second supply voltage GND, the drain of the NMOSFET Q33 is coupled to the first node A, and the gate of the NMOSFET Q33 is coupled to the first end of the resistor R1 and the second end of the capacitor Cb. The source of the NMOSFET Q34 is coupled to the second supply voltage GND, the drain of the NMOSFET Q34 is coupled to the second node B, and the gate of the NMOSFET Q34 is coupled to the first end of the resistor R2 and the second end of the capacitor Ca.

Figure 10:
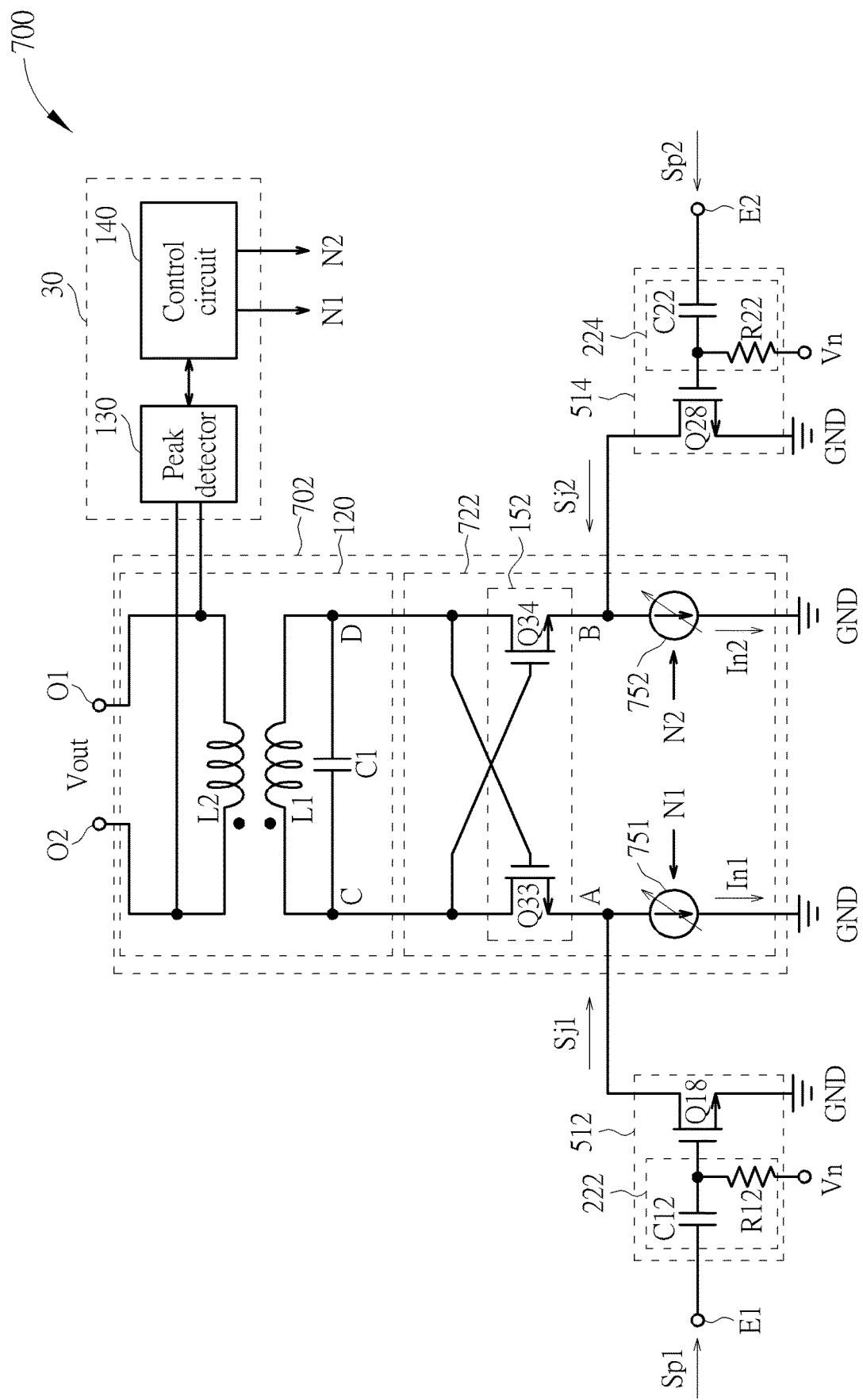
FIG. 10 is a circuit diagram of an oscillating circuit according to an eighth embodiment of the present invention.

Please refer to FIG. 10. FIG. 10 is a circuit diagram of an oscillating circuit 700 according to an eighth embodiment of the present invention. The main difference between the oscillating circuit 700 in FIG. 10 and the oscillating circuit 500 in FIG. 8 is that the Gm cell 522 of the oscillating circuit 500 is replaced by a Gm cell 722 of an ILO 702 of the oscillating circuit 700. The Gm cell 722 comprises a first current source 751, a second current source 752 and the pair 152 of the cross coupled NMOSFETs Q33 and Q34. A first end of the first current source 751 is coupled to the first node A, and a second end of the first current source 751 is coupled to the second supply voltage GND. A first end of the second current source 752 is coupled to the second node B, and a second end of the second current source 752 is coupled to the second supply voltage GND. The source of the NMOSFET Q33 is coupled to the first node A, the drain of the NMOSFET Q33 is coupled to the first output end C of the Gm cell 722, and the gate of the NMOSFET Q33 is coupled to the second output end D of the Gm cell 722. The source of the NMOSFET Q34 is coupled to the second node B, the drain of the NMOSFET Q34 is coupled to the second output end D of the Gm cell 722, and the gate of the NMOSFET Q34 is coupled to the first output end C of the Gm cell 722. The control circuit 140 of the calibration circuit 30 generates two control signals N1 and N2 based on the peak detected by the peak detector 130. The first current source 751 is controlled according to the control signal N1, and the second current source 752 is controlled according to the control signal N2. Therefore, the calibration circuit 30 would reduce the magnitude of the negative resistance |−R| by reducing a current In1 following through the first current source 751 and a current In2 following through the second current source 752 while tuning the resonant frequency of the LC tank 120.

Figure 11:
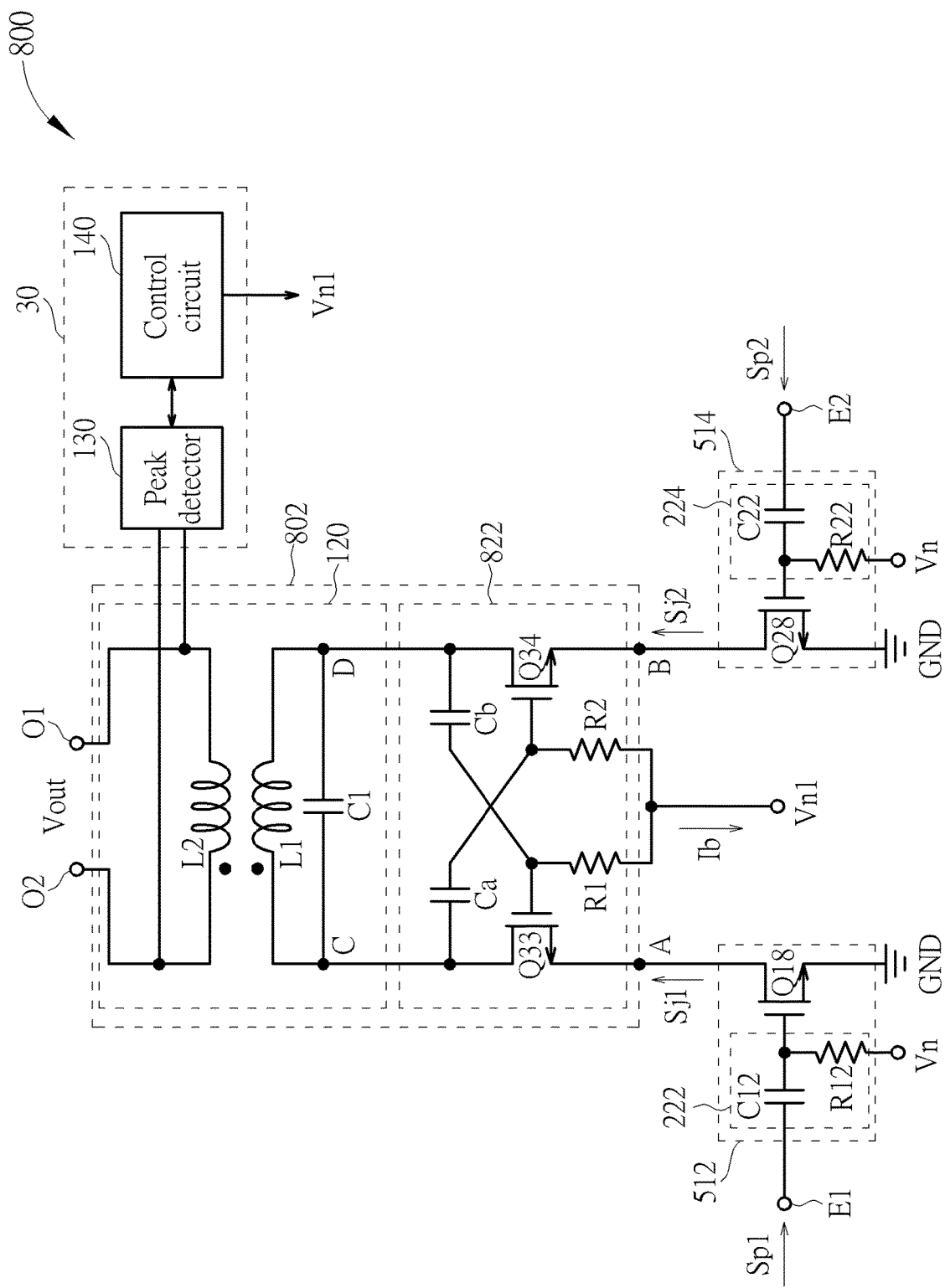
FIG. 11 is a circuit diagram of an oscillating circuit according to a ninth embodiment of the present invention.

Please refer to FIG. 11. FIG. 11 is a circuit diagram of an oscillating circuit 800 according to a ninth embodiment of the present invention. The main difference between the oscillating circuit 800 in FIG. 11 and the oscillating circuit 600 in FIG. 9 is that the first node A of a Gm cell 822 of an ILO 802 of the oscillating circuit 800 is coupled to the source of the NMOSFET Q33 and that the second node B of the Gm cell 822 is coupled to the source of the NMOSFET Q34. The first injection signal Sj1 is injected into the first node A, and the second injection signal Sj2 is injected into the second node B. The bias voltage Vn1 is generated by the control circuit 140 based on the peak detected by the peak detector 130. The current Ib is still controlled according to the bias voltage Vn1, and the calibration circuit 30 would reduce the magnitude of the negative resistance |−R| by adjusting a voltage level of the bias voltage Vn1.

Figure 12:
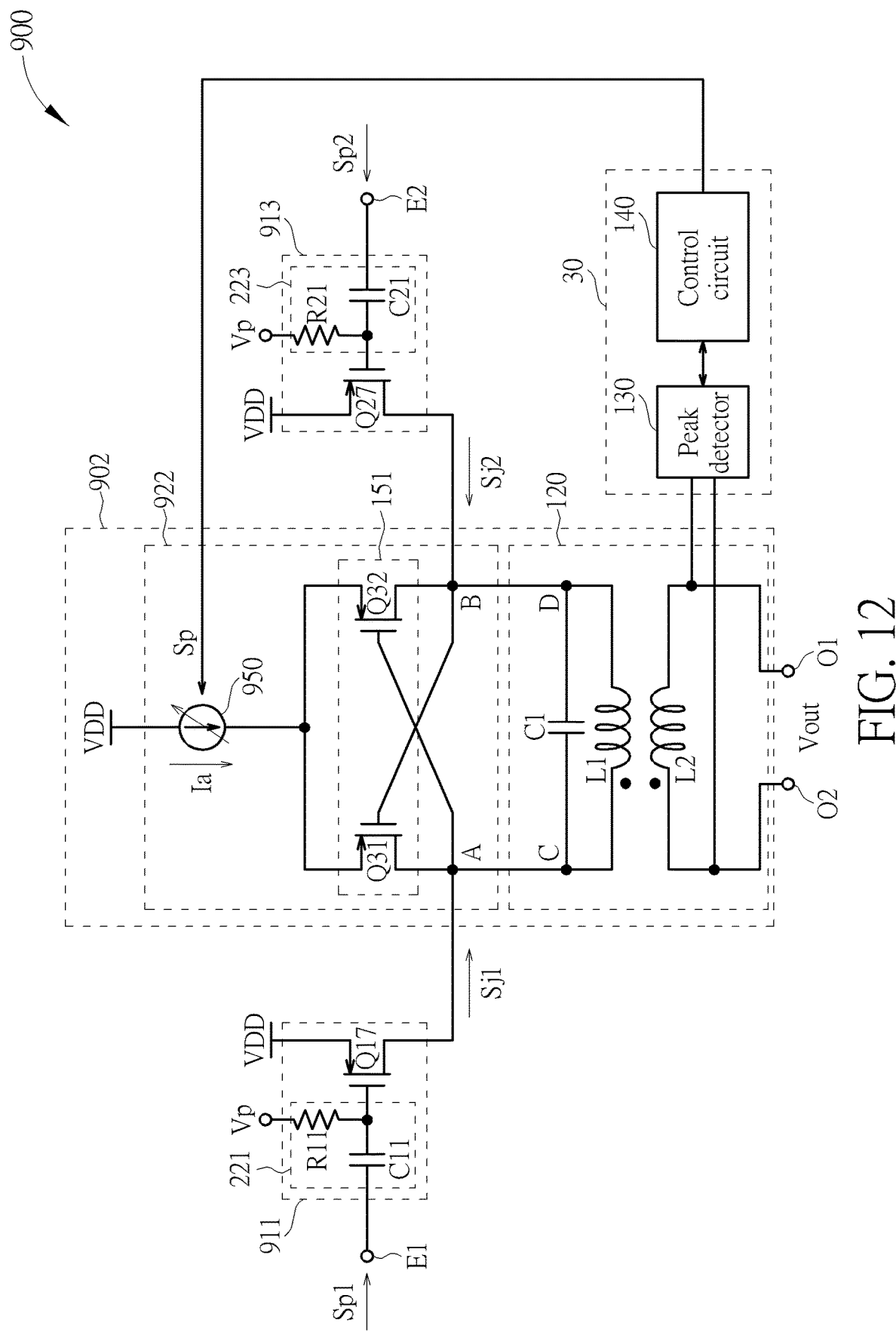
FIG. 12 is a circuit diagram of an oscillating circuit according to a tenth embodiment of the present invention.

Please refer to FIG. 12. FIG. 12 is a circuit diagram of an oscillating circuit 900 according to a tenth embodiment of the present invention. The main difference between the oscillating circuit 900 in FIG. 12 and the oscillating circuit 500 in FIG. 8 is that all transistors of the oscillating circuit 900 are PMOSFETS while all transistors of the oscillating circuit 500 are NMOSFETS. A Gm cell 922 of an ILO 902 of the oscillating circuit 900 comprises a current source 950 and the pair 151 of the cross coupled PMOSFETs Q31 and Q32. A first end of the current source 950 is coupled to the sources of the two PMOSFETs Q31 and Q32, and a second end of the current source 950 is coupled to the first supply voltage VDD. The drain of the PMOSFET Q31 is coupled to the first node A, and the gate of the PMOSFET Q31 is coupled to the second node B. The drain of the PMOSFET Q32 is coupled to the second node B, and the gate of the PMOSFET Q32 is coupled to the first node A. In the embodiment, the first output end C is directly coupled to the first node A, and the second output end D is directly coupled to the second node B. While tuning the resonant frequency of the LC tank 120, the control circuit 140 of the calibration circuit 30 transmits a control signal Sp to the current source 950 to reduce a current Ia following through the current source 950 so as to reduce the magnitude of the negative resistance |−R| to control the ILO 902 to stop self-oscillating. Then, the control circuit 140 of the calibration circuit 30 tunes the resonant frequency $$\left(\text{i.e., } \frac{1}{2\pi\sqrt{L_1 \times C_1}}\right)$$

of the LC tank 120 to the specific frequency of the injection signals Sj1 and Sj2 by adjusting the capacitance of the capacitor C1 and/or the inductance of the first inductor L1. When finishing tuning the resonant frequency of the LC tank 120 to the specific frequency of the injection signals Sj1 and Sj2, the control circuit 140 decrease the current Ia to increase the magnitude of the negative resistance |−R| so as to control the ILO 902 to start self-oscillating. Accordingly, an oscillation frequency of the ILO 902 would be injection-locked to the specific frequency of the injection signals Sj1 and Sj2 so as to complete calibration of the resonant frequency of the LC tank 120. Since the resonant frequency of the LC tank 120 could be accurately calibrated to be very close to the specific frequency of the injection signals Sj1 and Sj2, even if the bandwidth of the LC tank 120 is very narrow, the oscillation frequency of the ILO 902 would be injection-locked at the specific frequency of the injection signals Sj1 and Sj2 when tuning the resonant frequency of the LC tank 120 is finished and the ILO 902 starts to self-oscillate.

The oscillating circuit 900 may further comprises a first falling injection circuit 911 and a second falling injection circuit 913. The first falling injection circuit 911 is used to inject the first injection signal Sj1 into the first node A when the first reference signal Sp1 is at a falling edge. The second falling injection circuit 913 is used to inject the second injection signal Sj2 into the second node B when the second reference signal Sp2 is at a falling edge. The falling injection circuit 911 comprises the PMOS transistor Q17 and the high pass filter 221. The source of the PMOS transistor Q17 is directly coupled to the first supply voltage VDD. The high pass filter 221 is also used to filter out the DC component of the first reference signal Sp1 and comprises the resistor R11 and the capacitor C11. The second falling injection circuit 913 comprises the PMOS transistor Q27 and the high pass filter 223. The source of the PMOS transistor Q27 is directly coupled to first supply voltage VDD. The high pass filter 223 is also used to filter out the DC component of the second reference signal Sp2 and comprises the resistor R21 and the capacitor C21.

Figure 13:
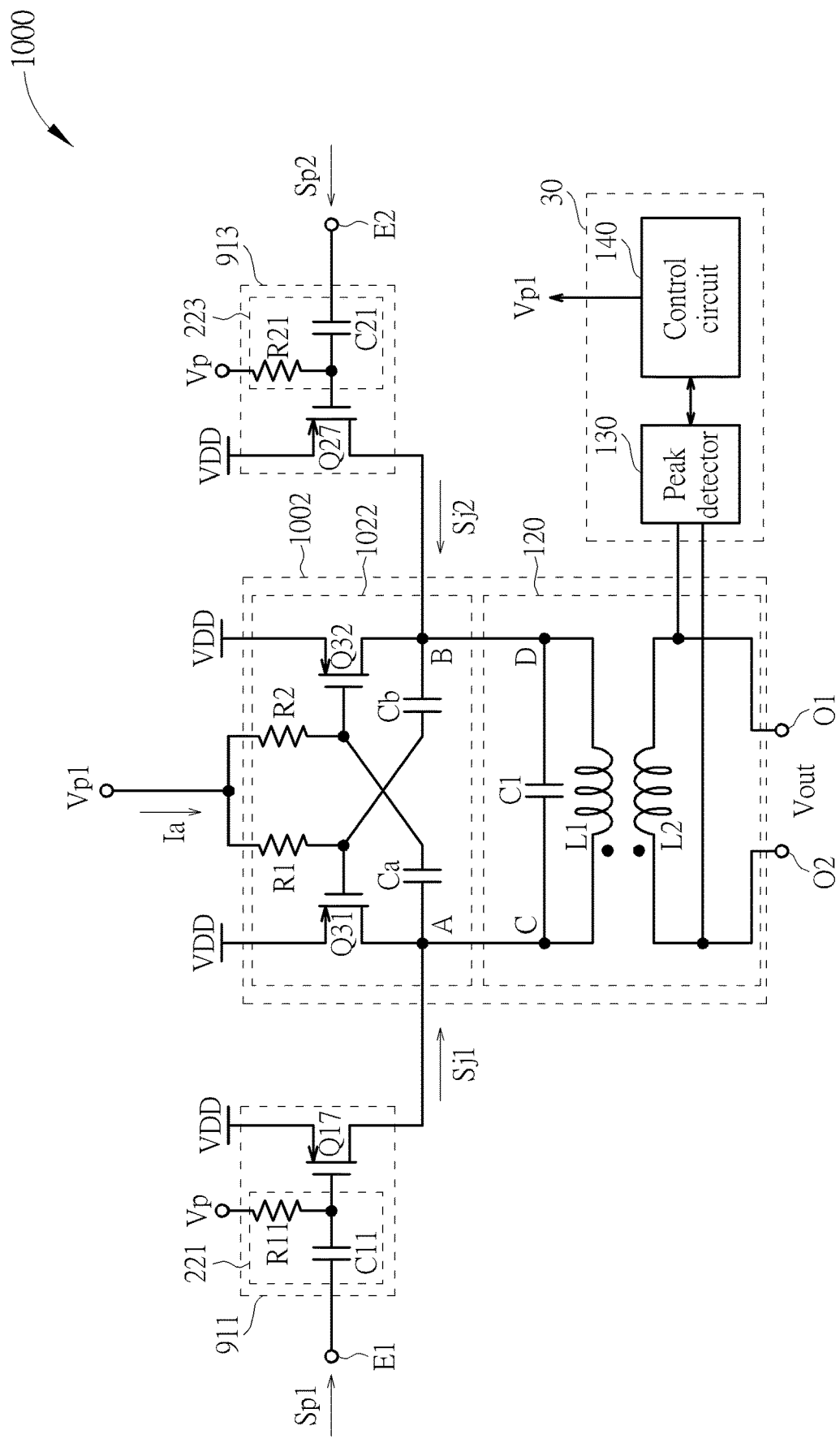
FIG. 13 is a circuit diagram of an oscillating circuit according to an eleventh embodiment of the present invention.

Please refer to FIG. 13. FIG. 13 is a circuit diagram of an oscillating circuit 1000 according to an eleventh embodiment of the present invention. The main difference between the oscillating circuit 1000 in FIG. 13 and the oscillating circuit 600 in FIG. 9 is that all transistors of the oscillating circuit 1000 are PMOSFETS while all transistors of the oscillating circuit 600 are NMOSFETS. A Gm cell 1022 of an ILO 1002 of the oscillating circuit 1000 comprises the two capacitors Ca and Cb, the two resistors R1 and R2, and the two PMOSFET Q31 and Q32. A first end of the capacitor Ca is coupled to the first node A, a second end of the capacitor Ca is coupled to a first end of the resistor R2 and the gate of the PMOSFET Q31. A first end of the capacitor Cb is coupled to the second node B, a second end of the capacitor Cb is coupled to a first end of the resistor R1 and the gate of the PMOSFET Q32. The resistor R1 is coupled between the second end of the capacitor Cb and a bias voltage Vp1, and the resistor R2 is coupled between the second end of the capacitor Ca and the bias voltage Vp1. The bias voltage Vp1 is generated by the control circuit 140 based on the peak detected by the peak detector 130. Therefore, the current Ia would be controlled based on the bias voltage Vp1, and the calibration circuit 30 would reduce the magnitude of the negative resistance |−R| by adjusting a voltage level of the bias voltage Vp1. The source of the PMOSFET Q31 is coupled to the first supply voltage VDD, the drain of the PMOSFET Q31 is coupled to the first node A, and the gate of the PMOSFET Q31 is coupled to the first end of the resistor R1 and the second end of the capacitor Cb. The source of the PMOSFET Q32 is coupled to the first supply voltage VDD, the drain of the PMOSFET Q32 is coupled to the second node B, and the gate of the PMOSFET Q32 is coupled to the first end of the resistor R2 and the second end of the capacitor Ca.

Figure 14:
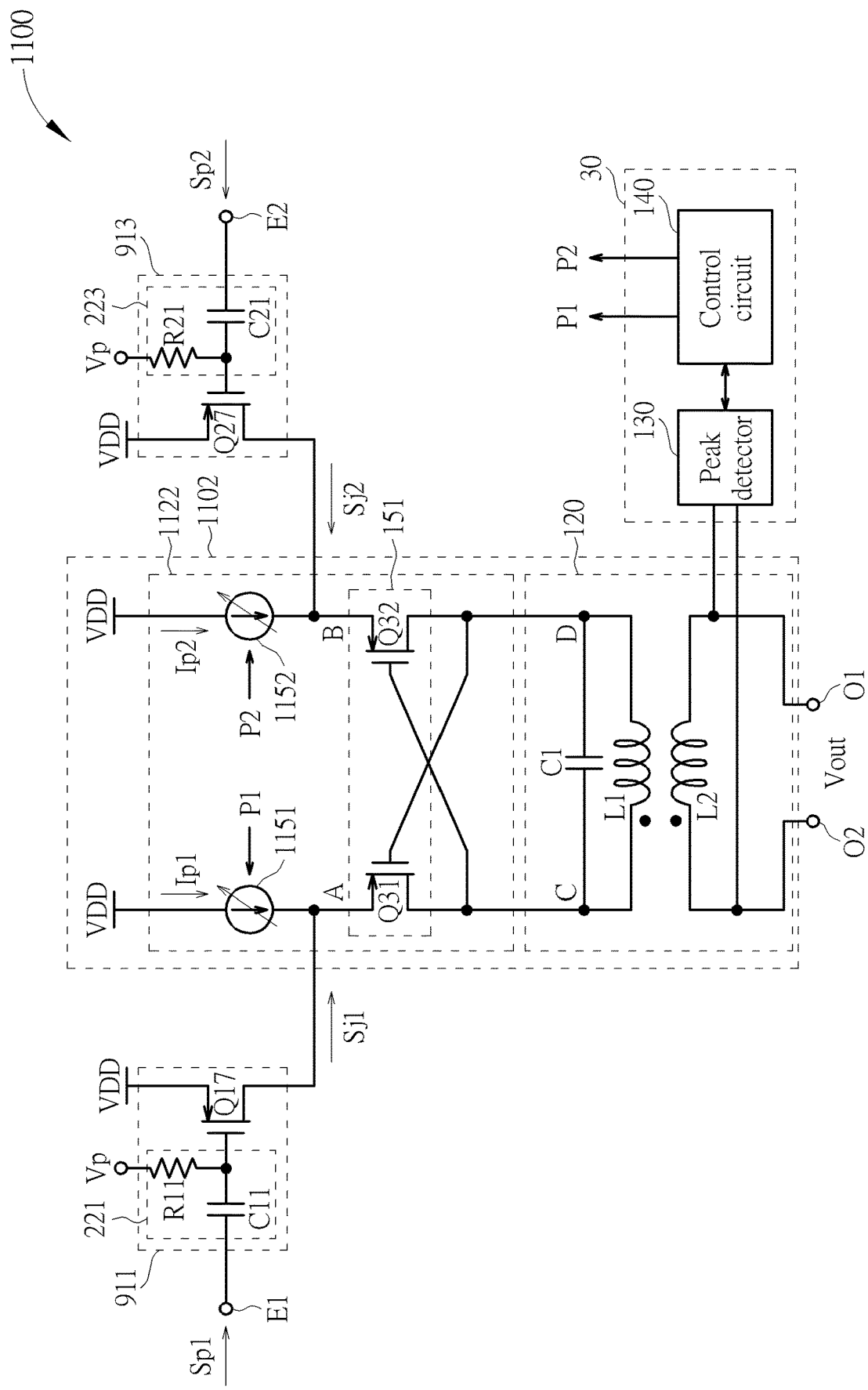
FIG. 14 is a circuit diagram of an oscillating circuit according to a twelfth embodiment of the present invention.

Please refer to FIG. 14. FIG. 14 is a circuit diagram of an oscillating circuit 1100 according to a twelfth embodiment of the present invention. The main difference between the oscillating circuit 1100 in FIG. 14 and the oscillating circuit 700 in FIG. 10 is that all transistors of the oscillating circuit 1100 are PMOSFETS while all transistors of the oscillating circuit 700 are NMOSFETS. A Gm cell 1122 of an ILO 1102 of the oscillating circuit 1100 comprises a first current source 1151, a second current source 1152 and the pair 151 of the cross coupled PMOSFETs Q31 and Q32. A first end of the first current source 1151 is coupled to the first node A, and a second end of the first current source 1151 is coupled to the first supply voltage VDD. A first end of the second current source 1152 is coupled to the second node B, and a second end of the second current source 1152 is coupled to the first supply voltage VDD. The source of the PMOSFET Q31 is coupled to the first node A, the drain of the PMOSFET Q31 is coupled to the first output end C of the Gm cell 1122, and the gate of the PMOSFET Q31 is coupled to the second output end D of the Gm cell 1122. The source of the PMOSFET Q32 is coupled to the second node B, the drain of the PMOSFET Q32 is coupled to the second output end D of the Gm cell 1122, and the gate of the PMOSFET Q32 is coupled to the first output end C of the Gm cell 1122. The control circuit 140 of the calibration circuit 30 generates two control signals P1 and P2 based on the peak detected by the peak detector 130. The first current source 1151 is controlled according to the control signal P1, and the second current source 1152 is controlled according to the control signal P2. Therefore, the calibration circuit 30 would reduce the magnitude of the negative resistance |−R| by reducing a current Ip1 following through the first current source 1151 and a current Ip2 following through the second current source 1152 while tuning the resonant frequency of the LC tank 120.

Figure 15:
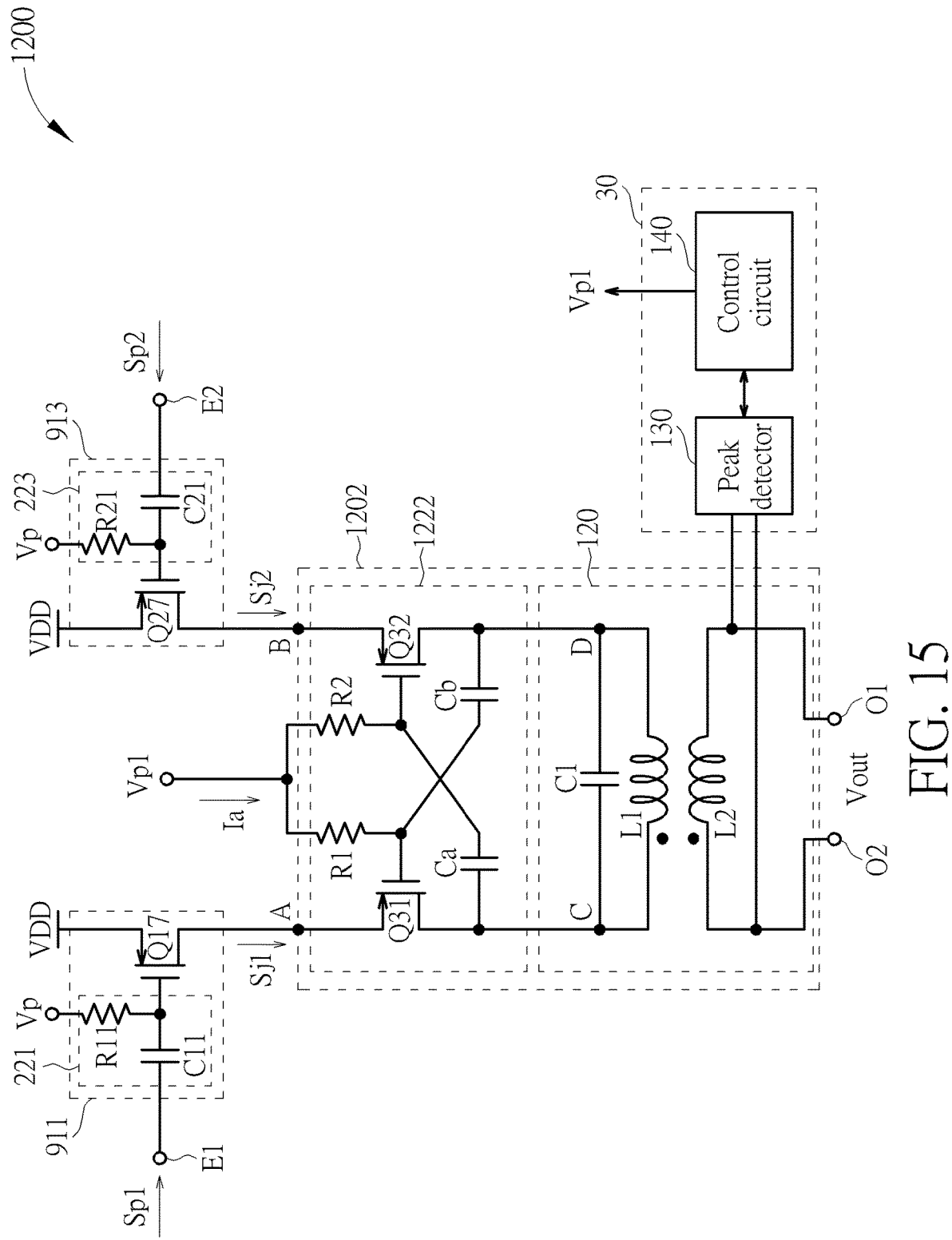
FIG. 15 is a circuit diagram of an oscillating circuit according to a thirteenth embodiment of the present invention.

Please refer to FIG. 15. FIG. 15 is a circuit diagram of an oscillating circuit 1200 according to a thirteenth embodiment of the present invention. The main difference between the oscillating circuit 1200 in FIG. 15 and the oscillating circuit 1000 in FIG. 13 is that the first node A of a Gm cell 1222 of an ILO 1202 of the oscillating circuit 1200 is coupled to the source of the PMOSFET Q31 and that the second node B of the Gm cell 1222 is coupled to the source of the PMOSFET Q32. The first injection signal Sj1 is injected into the first node A, and the second injection signal Sj2 is injected into the second node B. The bias voltage Vp1 is generated by the control circuit 140 based on the peak detected by the peak detector 130. The current Ia is still controlled according to the bias voltage Vp1, and the calibration circuit 30 would reduce the magnitude of the negative resistance |−R| by adjusting a voltage level of the bias voltage Vp1.

According to the embodiments of the present invention, the resonant frequency of the LC tank of the ILO could be accurately calibrated at the specific frequency of the injection signals by tuning the capacitance of the capacitor and/or the inductance of the first inductor of the LC tank while the ILO is controlled to stop self-oscillating by reducing the negative resistance provided by the Gm cell of the ILO. As a result, when the ILO starts to self-oscillate, the oscillation frequency of the ILO would be accurately injection-locked at the specific frequency of the injection signals.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An oscillating circuit, comprising:
an injection-locked oscillator (ILO), comprising:
a Gm cell, comprising:
a first node, for receiving a first injection signal;
a second node, for receiving a second injection signal, wherein the first injection signal and the second injection signal are differential signals;
a first output end; and
a second output end, wherein the Gm cell is configured to provide a negative resistance between the first output end and the second output end; and
an LC tank, comprising:
a first inductor, having a first end coupled to the second output end and a second end coupled to the first output end;
a first capacitor, having a first end coupled to the second output end and the first end of the first inductor and a second end coupled to the first output end and the second end of the first inductor; and
a second inductor, magnetically coupled to the first inductor for generating an output voltage; and
a calibration circuit, coupled to the LC tank, configured to tune a resonant frequency of the LC tank to a specific frequency of the first injection signal and the second injection signal, and further configured to control the ILO to stop self-oscillating by reducing magnitude of the negative resistance while tuning the resonant frequency of the LC tank.

2. The oscillating circuit of claim 1, wherein the calibration circuit comprises:
a peak detector, configured to detect a peak of swing of the output voltage; and
a control circuit, coupled to the peak detector, and configured to tune the resonant frequency of the LC tank based on the peak detected by the peak detector.

3. The oscillating circuit of claim 1, wherein the calibration circuit is further configured to control the ILO to start self-oscillating by increasing the magnitude of the negative resistance after finishing tuning the resonant frequency of the LC tank.

4. The oscillating circuit of claim 1, wherein the Gm cell comprises:
a first current element, a first end of the first current element being coupled to a first supply voltage, and a first current flowing through the first current element being controlled by the calibration circuit;
a pair of cross coupled P-type metal-oxide-semiconductor (PMOS) transistors, comprising:
a first PMOS transistor, a source of the first PMOS transistor being coupled to a second end of the first current element, a drain of the first PMOS transistor being coupled to the first node, and a gate of the first PMOS transistor being coupled to the second node; and
a second PMOS transistor, a source of the second PMOS transistor being coupled to a second end of the first current element, a drain of the second PMOS transistor being coupled to the second node, and a gate of the second PMOS transistor being coupled to the first node;
a second current element, a second end of the second current element is coupled to a second supply voltage; and
a pair of cross coupled N-type metal-oxide-semiconductor (NMOS) transistors, comprising:
a first NMOS transistor, a source of the first NMOS transistor being coupled to a first end of the second current element, a drain of the first NMOS transistor being coupled to the first node, and a gate of the first NMOS transistor being coupled to the second node; and
a second NMOS transistor, a source of the second NMOS transistor being coupled to a first end of the second current element, a drain of the second NMOS transistor being coupled to the second node, and a gate of the second NMOS transistor being coupled to the first node.

5. The oscillating circuit of claim 4, wherein the first current element is a first variable resistor, the second current element is a second variable resistor, and the calibration circuit reduces the magnitude of the negative resistance by increasing resistance of the first variable resistor and/or the second variable resistor while tuning the resonant frequency of the LC tank.

6. The oscillating circuit of claim 4, wherein the first current element is a first current source, the second current element is a second current source, and the calibration circuit reduces the magnitude of the negative resistance by reducing a first current following through the first current source and/or a second current flowing through the second current source while tuning the resonant frequency of the LC tank.

7. The oscillating circuit of claim 1, wherein the Gm cell comprises:
a current source, a second end of the current source is coupled to a supply voltage; and
a pair of cross coupled metal-oxide-semiconductor field-effect transistors (MOSFETs), comprising;
a first MOSFET, a source of the first MOSFET being coupled to a first end of the current source, a drain of the first MOSFET being coupled to the first node, and a gate of the first MOSFET being coupled to the second node; and
a second MOSFET, a source of the second MOSFET being coupled to a second end of the current source, a drain of the second MOSFET being coupled to the second node, and a gate of the second MOSFET being coupled to the first node;
wherein the calibration circuit reduces the magnitude of the negative resistance by reducing a current following through the current source while tuning the resonant frequency of the LC tank; and
wherein the first node is directly coupled to the first output end, and the second node is directly coupled to the second output end.

8. The oscillating circuit of claim 1, wherein the Gm cell comprises:
a second capacitor, a first end of the second capacitor being coupled to the first node;
a third capacitor, a first end of the second capacitor being coupled to the second node;
a first resistor, coupled between a second end of the third capacitor and a bias voltage;
a second resistor, coupled between a second end of the second capacitor and the bias voltage;
a first MOSFET, a source of the first MOSFET being coupled to a supply voltage, a drain of the first MOSFET being coupled to the first node, and a gate of the first MOSFET being coupled to the first end of the first resistor and the second end of the third capacitor; and
a second MOSFET, a source of the second MOSFET being coupled to the supply voltage, a drain of the second MOSFET being coupled to the second node, and a gate of the second MOSFET being coupled to the first end of the second resistor and the second end of the second capacitor;

wherein the calibration circuit reduces the magnitude of the negative resistance by adjusting a voltage level of the bias voltage; and wherein the first node is directly coupled to the first output end, and the second node is directly coupled to the second output end.

9. The oscillating circuit of claim 1, wherein the Gm cell comprises:
a first current source, a first end of the first current source being coupled to the first node, and a second end of the first current source is coupled to a supply voltage;
a second current source, a first end of the second current source being coupled to the second node, and a second end of the second current source is coupled to the supply voltage; and
a pair of cross coupled metal-oxide-semiconductor field-effect transistors (MOSFETs), comprising;
a first MOSFET, a source of the first MOSFET being coupled to the first node, a drain of the first MOSFET being coupled to the first output end of the Gm cell, and a gate of the first MOSFET being coupled to the second output end of the Gm cell; and
a second MOSFET, a source of the second MOSFET being coupled to the second node, a drain of the second MOSFET being coupled to the second output end of the Gm cell, and a gate of the second MOSFET being coupled to the first output end of the Gm cell;
wherein the calibration circuit reduces the magnitude of the negative resistance by reducing a current following through the first current source and a current following through the second current source while tuning the resonant frequency of the LC tank.

10. The oscillating circuit of claim 1, wherein the Gm cell comprises:
a second capacitor, a first end of the second capacitor being coupled to the first output end of the Gm cell;
a third capacitor, a first end of the second capacitor being coupled to the second output end of the Gm cell;
a first resistor, coupled between a second end of the third capacitor and a bias voltage;
a second resistor, coupled between a second end of the second capacitor and the bias voltage;
a first MOSFET, a source of the first MOSFET being coupled to the first node, a drain of the first MOSFET being coupled to the first output end of the Gm cell, and a gate of the first MOSFET being coupled to the first end of the first resistor and the second end of the third capacitor; and
a second MOSFET, a source of the second MOSFET being coupled to the second node, a drain of the second MOSFET being coupled to the second output end of the Gm cell, and a gate of the second MOSFET being coupled to the first end of the second resistor and the second end of the second capacitor;
wherein the calibration circuit reduces the magnitude of the negative resistance by adjusting a voltage level of the bias voltage.

11. The oscillating circuit of claim 1, wherein the calibration circuit tunes the resonant frequency of the LC tank by adjusting capacitance of the first capacitor and/or inductance of the first inductor.

12. The oscillating circuit of claim 1 further comprising:
a first push-pull injection circuit, configured to generate and output the first injection signal to the first node of the ILO; and
a second push-pull injection circuit, configured to generate and output the second injection signal to the second node of the ILO;
wherein the first push-pull injection circuit is further configured to push a voltage level of the first node up while the second push-pull injection circuit pulls a voltage level of the second node down; and
wherein the first push-pull injection circuit is further configured to pull the voltage level of the first node down while the second push-pull injection circuit pushes the voltage level of the second node up.

13. The oscillating circuit of claim 12, wherein the first push-pull injection circuit comprises:
a first input node, for receiving a first reference signal;
a first falling injection circuit, comprising:
a first resistor, a first end of the first resistor being coupled to a first supply voltage;
a third PMOS transistor, a source of the third PMOS transistor being coupled to a second end of the first resistor, and a drain of the third PMOS transistor being coupled to the first node of the ILO; and
a first high pass filter, coupled between the first input node and a gate of the third PMOS transistor; and
a first rising injection circuit, comprising:
a second resistor, a second end of the second resistor being coupled to a second supply voltage; and
a third NMOS transistor, a source of the third NMOS transistor being coupled to a first end of the second resistor, and a drain of the third NMOS transistor being coupled to the first node of the ILO; and
a second high pass filter, coupled between the first input node and a gate of the third NMOS transistor;
wherein the second push-pull injection circuit comprises:
a second input node, for receiving a second reference signal, wherein the first reference signal and the second reference signal are complementary to each other;
a second falling injection circuit, comprising:
a third resistor, a first end of the third resistor being coupled to the first supply voltage;
a fourth PMOS transistor, a source of the fourth PMOS transistor being coupled to a second end of the third resistor, and a drain of the fourth PMOS transistor being coupled to the second node of the ILO; and
a third high pass filter, coupled between the second input node and a gate of the fourth PMOS transistor; and
a second rising injection circuit, comprising:
a fourth resistor, a second end of the fourth resistor being coupled to the second supply voltage; and
a fourth NMOS transistor, a source of the fourth NMOS transistor being coupled to a first end of the fourth resistor, and a drain of the fourth NMOS transistor being coupled to the second node of the ILO; and
a fourth high pass filter, coupled between the second input node and a gate of the fourth NMOS transistor.

14. The oscillating circuit of claim 13 further comprising:
a first main input end, configured to receive a first clock signal;
a second capacitor, a first end of the second capacitor being coupled to the first main input end;

a first inverter, an input end of the first inverter being coupled to a second end of the second capacitor, and an output end of the first inverter being coupled to the first input node;
a first feedback resistor, coupled between the input end of the first inverter and the output end of the first inverter;
a second main input, configured to receive a second clock signal end, wherein the first clock signal and the second clock signal are complementary to each other;
a third capacitor, a first end of the third capacitor being coupled to the second main input end; and
a second inverter, an input end of the second inverter being coupled to a second end of the third capacitor, and an output end of the second inverter being coupled to the second input node; and
a second feedback resistor, coupled between the input end of the second inverter and the output end of the second inverter.

15. The oscillating circuit of claim 13 further comprising:
a first main input end, configured to receive a first clock signal;
a second capacitor, a first end of the second capacitor being coupled to the first main input end;
a first inverter chain, an input end of the first inverter chain being coupled to a second end of the second capacitor, and an output end of the first inverter chain being coupled to the first input node;
a first feedback resistor, coupled between the input end of the first inverter chain and an output end of a first inverter of the first inverter chain;
a second main input, configured to receive a second clock signal end, wherein the first clock signal and the second clock signal are complementary to each other;
a third capacitor, a first end of the third capacitor being coupled to the second main input end; and
a second inverter chain, an input end of the second inverter chain being coupled to a second end of the third capacitor, and an output end of the second inverter chain being coupled to the second input node; and
a second feedback resistor, coupled between the input end of the second inverter chain and an output end of a first inverter of the second inverter chain.

16. A method of calibrating an oscillating circuit, the oscillating circuit comprising:
an injection-locked oscillator (ILO), comprising:
a Gm cell, comprising:
a first node, for receiving a first injection signal;
a second node, for receiving a second injection signal, wherein the first injection signal and the second injection signal are differential signals;
a first output end; and
a second output end, wherein the Gm cell is configured to provide a negative resistance between the first output end and the second output end; and
an LC tank, comprising:
a first inductor, having a first end coupled to the second output end and a second end coupled to the first output end; and
a first capacitor, having a first end coupled to the second output end and the first end of the first inductor and a second end coupled to the first output end and the second end of the first inductor;
the method comprising:
tuning a resonant frequency of the LC tank to a specific frequency of the first injection signal and the second injection signal; and
controlling the ILO to stop self-oscillating by reducing magnitude of the negative resistance while tuning the resonant frequency of the LC tank.

17. The method of claim 16, wherein the oscillating circuit further comprising a peak detector, configured to detect a peak of swing of the output voltage;
wherein the resonant frequency of the LC tank is tuned based on the peak detected by the peak detector.

18. The method of claim 16 further comprising:
controlling the ILO to start self-oscillating by increasing the magnitude of the negative resistance after finishing tuning the resonant frequency of the LC tank.

* * * * *